United States Patent
Ishigaki

(10) Patent No.: US 11,125,793 B2
(45) Date of Patent: Sep. 21, 2021

(54) DEMAND MONITORING DEVICE, DEMAND MONITORING SYSTEM, DEMAND MONITORING METHOD, AND DEMAND MONITORING PROGRAM

(71) Applicant: Sumitomo Electric Industries, Ltd., Osaka (JP)

(72) Inventor: Yoshihisa Ishigaki, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 470 days.

(21) Appl. No.: 16/090,903

(22) PCT Filed: Mar. 6, 2017

(86) PCT No.: PCT/JP2017/008795
§ 371 (c)(1),
(2) Date: Oct. 3, 2018

(87) PCT Pub. No.: WO2017/183337
PCT Pub. Date: Oct. 26, 2017

(65) Prior Publication Data
US 2019/0128933 A1    May 2, 2019

(30) Foreign Application Priority Data

Apr. 22, 2016  (JP) .............................. JP2016-085877

(51) Int. Cl.
*G01R 22/10* (2006.01)
*G06F 16/901* (2019.01)
(Continued)

(52) U.S. Cl.
CPC ............... *G01R 22/10* (2013.01); *G01W 1/10* (2013.01); *G06F 16/9024* (2019.01); *H02J 3/14* (2013.01);
(Continued)

(58) Field of Classification Search
CPC ...... G01R 22/10; G01W 1/10; G06F 16/9024; H02J 13/00001; H02J 2203/20;
(Continued)

(56) References Cited

U.S. PATENT DOCUMENTS

| 9,588,145 B2* | 3/2017 | Honjo ..................... G01R 11/56 |
| 2013/0127443 A1* | 5/2013 | Honjo ..................... G06Q 50/06 |
| | | 324/103 R |

(Continued)

FOREIGN PATENT DOCUMENTS

| JP | H11-346438 A | 12/1999 |
| JP | 2013-240137 A | 11/2013 |

(Continued)

*Primary Examiner* — John H Le
(74) *Attorney, Agent, or Firm* — Baker Botts L.L.P.; Michael A. Sartori

(57) ABSTRACT

A demand monitoring device which monitors an amount of electric power received by a consumer includes: a prediction unit predicting, every demand period, received electric power in the object demand period on the basis of at least one of demand electric power, generated electric power, and received electric power at a time previous to the demand period, a known schedule of the consumer in the demand period, and weather information; a creation unit creating a graph showing an amount of electric power received by the consumer until a current time, a predicted value for an amount of received electric power from the current time onward, the predicted value being predicted by the prediction unit, and a target electric power amount based on contract electric power of the consumer; and a display control unit displaying the graph created by the creation unit, on a screen of a display device.

15 Claims, 16 Drawing Sheets

(51) Int. Cl.
  *G01W 1/10* (2006.01)
  *H02J 3/38* (2006.01)
  *H02J 3/32* (2006.01)
  *H02J 3/14* (2006.01)
  *H02J 13/00* (2006.01)
  *H02J 3/00* (2006.01)

(52) U.S. Cl.
  CPC .................. *H02J 3/32* (2013.01); *H02J 3/38* (2013.01); *H02J 13/00001* (2020.01); *H02J 3/003* (2020.01); *H02J 2203/20* (2020.01); *Y02B 70/3225* (2013.01); *Y04S 20/222* (2013.01)

(58) Field of Classification Search
  CPC .... H02J 3/003; H02J 3/004; H02J 3/14; H02J 3/32; H02J 3/38; Y02B 70/3225; Y02E 60/00; Y04S 10/40; Y04S 10/50; Y04S 20/222; Y04S 40/20

USPC .......................................................... 702/61
  See application file for complete search history.

(56) References Cited

U.S. PATENT DOCUMENTS

2016/0266181 A1* 9/2016 Kawaguchi .......... G01R 21/133
  2017/0017215 A1* 1/2017 Shimizu ................. G05B 15/02

FOREIGN PATENT DOCUMENTS

| JP | 2013-255390 A | 12/2013 |
  |---|---|---|
  | JP | 2014-050256 A | 3/2014 |
  | JP | 2014-236579 A | 12/2014 |
  | JP | 2015-035883 A | 2/2015 |
  | JP | 2015-156785 A | 8/2015 |

* cited by examiner

DEMAND MONITORING DEVICE, DEMAND MONITORING SYSTEM, DEMAND MONITORING METHOD, AND DEMAND MONITORING PROGRAM

TECHNICAL FIELD

The present invention relates to a demand monitoring device, a demand monitoring system, a demand monitoring method, and a demand monitoring program.

This application claims priority on Japanese Patent Application No. 2016-085877 filed on Apr. 22, 2016, the entire contents of which are incorporated herein by reference.

BACKGROUND ART

A consumer such as a building or a factory has previously made a contract with an electric power company, which supplies electric power, for maximum electric power (contract electric power) to be supplied. When average electric power received by the consumer from the electric power company during a demand period (for example, 30 minutes) exceeds the contract electric power, the consumer needs to pay a forfeit to the electric power company. Thus, a demand monitoring device that manages electric power received by the consumer such that the received electric power does not exceed the contract electric power has been put on the market (see, for example, PATENT LITERATURE 1 and 2).

A conventional demand monitoring device predicts an amount of received electric power in a demand period, and when a predicted value for an amount of received electric power at the end of the demand period exceeds a target electric power amount, the conventional demand monitoring device performs control of electric power equipment, which is installed in the consumer, for example, by providing a notification to a manager through output of a warning or sending of an E-mail to the manager, or automatically cutting the electric power supply to the electric power equipment. The target electric power amount is set, on the basis of the contract electric power, to such a value that the average electric power in the demand period is prevented from exceeding the contract electric power. The manager who has received the notification can prevent the amount of received electric power from exceeding the target electric power amount, for example, by manually cutting the electric power supply to the electric power equipment. Through such processing, the average electric power in the demand period can be prevented from exceeding the contract electric power.

In addition, in the conventional demand monitoring device, a graph called a demand load curve and showing a predicted value for received electric power is displayed on a screen. By looking at the graph, the manager can know how much the predicted value for an amount of received electric power is likely to exceed the target electric power amount, when the predicted value is likely to exceed the target electric power amount, etc.

FIG. 14 is a diagram showing an example of a conventional graph of a demand load curve. In the graph shown in FIG. 14, the horizontal axis indicates a time in a demand period including the current time, and the vertical axis indicates an amount of electric power received from the electric power company. In addition, the current time is assumed to be a time after 15 minutes from the start of the demand period. On the graph, a received electric power amount 35 that is an amount of electric power received from the electric power company from the start of the demand period to the current time is shown. In addition, on the graph, a predicted received electric power amount 37 that is a predicted value for an amount of electric power received from the electric power company from the current time to the end of the demand period is shown.

The predicted received electric power amount 37 (Y) can be calculated by the following Equation 1 on the basis of: the received electric power amount 35 (X) at the current time; the gradient ($\Delta x/\Delta t$) of a straight line connecting the received electric power amount 35 at the current time to the received electric power amount 35 at a time that is earlier than the current time by $\Delta t$ seconds; and a remaining time t from the current time to the end of the demand period.

$$Y = X + (\Delta x/\Delta t) \times t \qquad \text{(Eq. 1)}$$

Furthermore, on the graph, a target electric power amount 38 is shown. The target electric power amount 38 may be an electric power amount corresponding to the contract electric power (=contract electric power×0.5 hour), or may be a value lower or higher than the electric power amount corresponding to the contract electric power, by a predetermined electric power amount.

By looking at the graph as shown in FIG. 14, the manager can know whether the predicted received electric power amount 37 exceeds the target electric power amount 38 at the end of the demand period. When the predicted received electric power amount 37 is likely to exceed the target electric power amount 38, the manager can take a countermeasure such as turning off the power of the electric power equipment.

CITATION LIST

Patent Literature

PATENT LITERATURE 1: Japanese Laid-Open Patent Publication No. 2014-236579
PATENT LITERATURE 2: Japanese Laid-Open Patent Publication No. 2013-240137

SUMMARY OF INVENTION (1) A demand monitoring device according to one embodiment of the present invention is a demand monitoring device which monitors an amount of electric power received by a consumer and includes: a prediction unit predicting, every demand period, received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(4) A demand monitoring device according to another embodiment of the present invention is a demand monitoring device which monitors an amount of electric power received by a consumer and includes: a plan calculation unit calculating a planned received electric power which is a planned value for received electric power of the consumer, by calculating an operation plan of electric power equipment on the basis of predicted demand electric power obtained by predicting demand electric power of the consumer, the electric power equipment being installed in the consumer; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer; and a display control unit displaying the graph created by the creation unit, on a screen of a display device.

(9) A demand monitoring method according to another embodiment of the present invention is a demand monitoring method for monitoring an amount of electric power received by a consumer and includes: a prediction step of predicting, every demand period, received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information; a creation step of creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted in the prediction step, and (iii) a target electric power amount based on contract electric power of the consumer; and a display control step of displaying the graph created in the creation step, on a screen of a display device.

(10) A demand monitoring method according to another embodiment of the present invention is a demand monitoring method for monitoring an amount of electric power received by a consumer and includes: a plan calculation step of calculating a planned received electric power which is a planned value for received electric power of the consumer, by calculating an operation plan of electric power equipment on the basis of predicted demand electric power obtained by predicting demand electric power of the consumer, the electric power equipment being installed in the consumer; a creation step of creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated in the plan calculation step, and (iii) a target electric power amount based on contract electric power of the consumer; and a display control step of displaying the graph created in the creation step, on a screen of a display device.

(11) A demand monitoring program according to another embodiment of the present invention is a demand monitoring program for monitoring an amount of electric power received by a consumer and causes a computer to function as: a prediction unit predicting, every demand period, received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(12) A demand monitoring program according to another embodiment of the present invention is a demand monitoring program for monitoring an amount of electric power received by a consumer and causes a computer to function as: a plan calculation unit calculating a planned received electric power which is a planned value for received electric power of the consumer, by calculating an operation plan of electric power equipment on the basis of predicted demand electric power obtained by predicting demand electric power of the consumer, the electric power equipment being installed in the consumer; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer; and a display control unit displaying the graph created by the creation unit, on a screen of a display device.

(13) The demand monitoring device in (1) can also be represented as follows.

Specifically, the demand monitoring device in (1) is a demand monitoring device which monitors an amount of electric power received by a consumer and includes: a prediction unit predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(14) The demand monitoring method in (9) can also be represented as follows.

Specifically, the demand monitoring method in (9) is a demand monitoring method for monitoring an amount of electric power received by a consumer and includes: a prediction step of predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation step of creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted in the prediction step, and (iii) a target electric power amount based on contract electric power of the consumer; and a display control step of displaying the graph created in the creation step, on a screen of a display device.

(15) The demand monitoring program in (11) can also be represented as follows.

Specifically, the demand monitoring program in (11) is a demand monitoring program for monitoring an amount of electric power received by a consumer and causes a computer to function as: a prediction unit predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(16) From the viewpoint of a system, provided is a demand monitoring system which monitors an amount of electric power received by a consumer, the demand monitoring system including: a prediction unit predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(17) From another viewpoint of a system, provided is a demand monitoring system which monitors an amount of electric power received by a consumer, the demand monitoring system including: a plan calculation unit calculating a planned received electric power which is a planned value for received electric power of the consumer, by calculating an operation plan of electric power equipment on the basis of predicted demand electric power obtained by predicting demand electric power of the consumer, the electric power equipment being installed in the consumer; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer; and a display control unit displaying the graph created by the creation unit, on a screen of a display device.

The present invention can be realized as a semiconductor integrated circuit that realizes a part or the entirety of a demand monitoring device or a demand monitoring system.

DESCRIPTION OF EMBODIMENTS

Problems to be Solved by Disclosure

Figure 14:
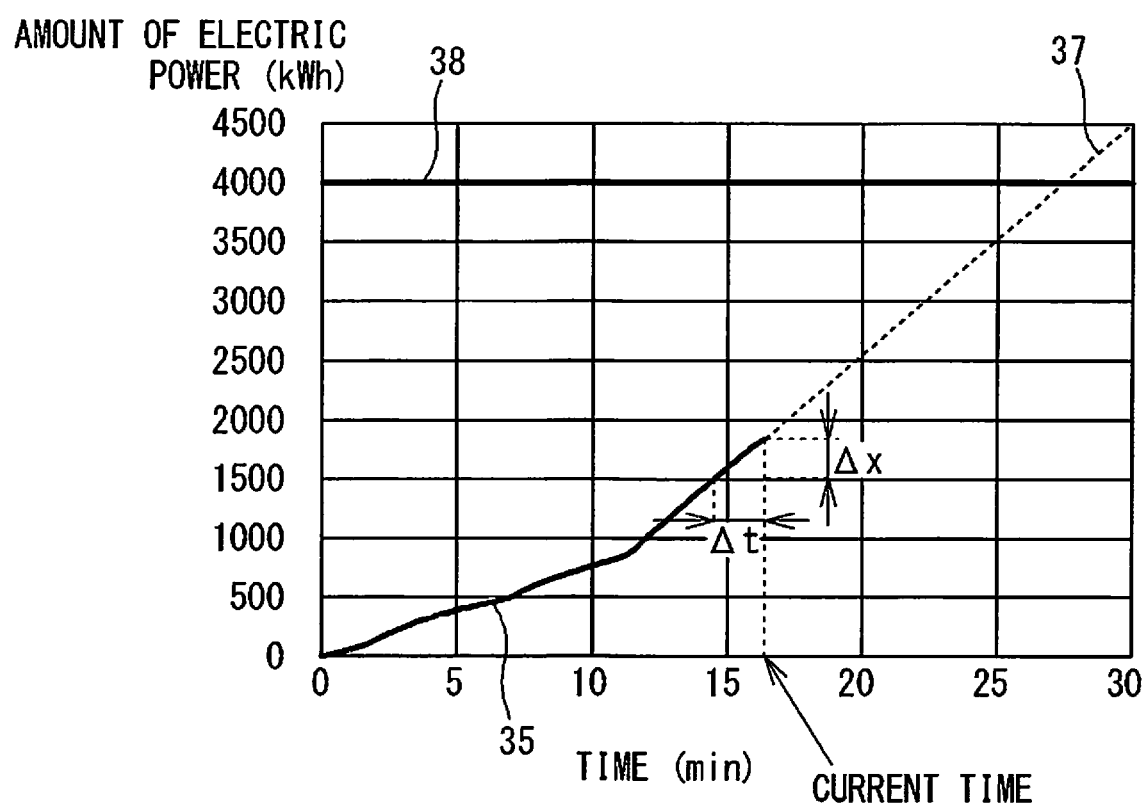
FIG. 14 is a diagram showing an example of a conventional graph of a demand load curve.

According to the conventional demand monitoring device, as shown in FIG. 14, the predicted received electric power amount 37 is calculated on the basis of the received electric power amount 35 at the current time and the received electric power amount 35 at the time that is earlier than the current time by $\Delta t$ seconds. Thus, when the amount of received electric power temporarily becomes large, the gradient ($\Delta x/\Delta t$) of Equation 1 becomes large, and the predicted received electric power amount 37 at the end of the demand period exceeds the target electric power amount 38. Thus, even when the amount of received electric power decreases later so that the amount of received electric power at the end of the demand period becomes equal to or less than the target electric power amount 38, the manager has to take a countermeasure for reducing the electric power amount, so that there is a problem that the electric power amount is excessively reduced.

In addition, when the amount of received electric power temporarily becomes large, a notification is provided from the demand monitoring device to the manager via a warning or E-mail. Such a notification is provided regardless whether it is a holiday or during late at night, and the manager has to take action each time a notification is provided, so that the burden on the manager increases.

The present disclosure has been made in view of the above circumstances, and an object of the present disclosure is to provide a demand monitoring device, a demand monitoring system, a demand monitoring method, and a demand monitoring program that display a graph from which whether an amount of electric power received from an electric power company will exceed a target electric power amount can be predicted with high accuracy.

Advantageous Effects of Disclosure

According to the present disclosure, a graph from which whether an amount of electric power received from an electric power company will exceed a target electric power amount can be predicted with high accuracy, can be displayed.

SUMMARY OF EMBODIMENTS

Summary of embodiments of the present invention includes at least the following.

(1) A demand monitoring device according to one embodiment of the present invention is a demand monitoring device which monitors an amount of electric power received by a consumer and includes: a prediction unit predicting, every demand period, received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

According to this configuration, the prediction unit predicts received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information. Thus, even when electric power is temporarily and excessively consumed in the demand period so that the received electric power temporarily becomes large, the prediction unit can predict received electric power regardless of the large received electric power. For example, the prediction unit can predict received electric power in a demand period by using a statistical prediction method on the basis of received electric power on the same dates of the weeks and in the same time period in a past predetermined period as the demand period. The predicted value for an amount of received electric power shown on the graph is calculated on the basis of the received electric power predicted by the prediction unit. Thus, even when the amount of received electric power temporarily becomes large in the demand period, the predicted value for an amount of received electric power does not exceed the target electric power amount each time the amount of received electric power becomes large, and the predicted value for an amount of received electric power can be accurately shown on the graph. Therefore, a manager can predict whether the amount of electric power received from an electric power company will exceed the target electric power amount, with high accuracy.

Accordingly, the necessity for the manager to unnecessarily take a countermeasure for reducing the amount of received electric power is eliminated. In the specification, the term "consumer" refers to not only a person who is supplied with and uses electric power but also a facility that is supplied with and uses electric power.

(2) Preferably, every demand period, the prediction unit predicts received electric power in the demand period on the basis of: at least one of demand electric power of the consumer at a time previous to the demand period, electric power generated by the consumer at the previous time, electric power received by the consumer at the previous time, a known schedule of the consumer in the demand period, predicted weather information, and observed weather information; and at least one of demand electric power of the consumer in the demand period, electric power generated by the consumer in the demand period, and electric power received by the consumer in the demand period.

According to this configuration, received electric power in a demand period can be predicted in consideration of demand electric power, generated electric power, or actual received electric power in the demand period. For example, when the difference between a predicted value for received electric power, in a demand period, calculated on the basis of the electric power received by the consumer at a time previous to the demand period and an actual value of received electric power in the demand period, is equal to or greater than a predetermined value, the predicted value for received electric power is corrected by increasing or decreasing the predicted value for received electric power by the difference such that the predicted value for received electric power coincides with the actual value of received electric power. Accordingly, received electric power can be accurately predicted.

(3) Preferably, the prediction unit predicts a plurality of received electric powers in the object demand period by using a plurality of prediction methods for predicting received electric power, and the creation unit creates the graph showing, as the predicted value for an amount of received electric power from the current time onward, a plurality of predicted values for an amount of received electric power from the current time onward, the predicted values being predicted by the prediction unit.

According to this configuration, a plurality of received electric powers are predicted by using the plurality of prediction methods, and a plurality of predicted values for an amount of received electric power from the current time onward are calculated on the basis of the predicted plurality of received electric powers. The calculated plurality of predicted values for an amount of received electric power are shown on the graph. Thus, the manager can know relationships between the plurality of received electric power amounts and the target electric power amount and can predict whether the amount of electric power received from the electric power company will exceed the target electric power amount, with higher accuracy. For example, when even at least one of a plurality of predicted values for an amount of received electric power exceeds the target electric power amount, the manager may take a countermeasure for reducing the amount of received electric power, at that time. Accordingly, the manager can predict whether the amount of received electric power will exceed the target electric power amount, with high accuracy as compared to the case where one predicted value for an amount of received electric power is displayed.

(4) A demand monitoring device according to another embodiment of the present invention is a demand monitoring device which monitors an amount of electric power received by a consumer and includes: a plan calculation unit calculating a planned received electric power which is a planned value for received electric power of the consumer, by calculating an operation plan of electric power equipment on the basis of predicted demand electric power obtained by predicting demand electric power of the consumer, the electric power equipment being installed in the consumer; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer; and a display control unit displaying the graph created by the creation unit, on a screen of a display device.

According to this configuration, a planned value for received electric power (planned received electric power) is calculated by calculating an operation plan of the electric power equipment. When the electric power equipment has been operated as per the operation plan, the received electric power is as shown by the planned received electric power. Thus, by looking at the graph on which the planned value for an amount of received electric power is shown, the manager can predict whether the amount of electric power received from the electric power company will exceed the target electric power amount, with high accuracy.

Accordingly, the necessity for the manager to unnecessarily take a countermeasure for reducing the amount of received electric power is eliminated. When the plan calculation unit calculates an operation plan of the electric power equipment such that an amount of received electric power will not exceed the target electric power amount, the amount of received electric power does not exceed the target electric power amount as long as the electric power equipment is operated as per the operation plan. As described above, since the demand monitoring device has the function of an EMS (energy management system), electric power received from the electric power company can be controlled such that the amount of received electric power does not exceed the target electric power amount.

(5) Preferably, the plan calculation unit calculates the planned received electric power for which output electric power of a distributed power source installed in the consumer is taken into consideration, by calculating an operation plan of the electric power equipment including the distributed power source on the basis of the predicted demand electric power.

According to this configuration, an operation plan of the distributed power source is also calculated when an operation plan of the electric power equipment is calculated.

Accordingly, a planned value for an amount of received electric power for which an amount of electric power generated by the distributed power source is taken into consideration can be shown on the graph.

(6) The creation unit may create the graph further showing an electric power amount calculated on the basis of the predicted demand electric power.

According to this configuration, a predicted demand electric power amount corresponding to the predicted demand electric power can be shown on the graph. Thus, by visually comparing the planned value for an amount of received electric power and the predicted demand electric power amount, the amount of electric power generated by the distributed power source can be known. That is, a value obtained by subtracting the planned value for an amount of received electric power from the predicted demand electric power amount is the amount of electric power generated by the distributed power source.

(7) The creation unit may create the graph further showing a confidence interval of the predicted value or the planned value for an amount of received electric power from the current time onward.

According to this configuration, by looking at the graph on which the confidence interval is shown, the manager can know a possibility that the amount of received electric power will exceed the target electric power amount. For example, when the entirety of the confidence interval exceeds the target electric power amount at the end of the object demand period; the manager can determine that there is a very high possibility that the amount of received electric power will exceed the target electric power amount. In such a case, the manager can take a countermeasure, such as turning off the power of the electric power equipment, with a sense of urgency.

(8) Preferably, the aforementioned demand monitoring device further includes an execution unit executing at least either notification to a manager or control of electric power equipment on the basis of a relationship between the predicted value or the planned value for an amount of received electric power from the current time onward and the target electric power amount, and the execution unit further executes at least either notification to the manager or control of the electric power equipment on the basis of a relationship between the confidence interval of the predicted value or the planned value for an amount of received electric power and the target electric power amount.

According to this configuration, the execution unit can execute at least either output of a warning or control of the electric power equipment, depending on the magnitude of a possibility that the amount of received electric power will exceed the target electric power amount. For example, when the entirety of the confidence interval exceeds the target electric power amount at the end of the object demand period and thus it can be determined that the possibility that the predicted value or the planned value for an amount of received electric power will exceed the target electric power amount is relatively high, the execution unit may provide a notification to the manager via E-mail or the like and immediately execute control in which the power of the electric power equipment is turned off. In addition, when a part of the confidence interval exceeds the target electric power amount at the end of the object demand period and thus there is a possibility that the amount of received electric power will exceed the target electric power amount but it can be determined that the possibility is relatively low, the execution unit may provide a notification to the manager via E-mail or the like but keep the power of the electric power equipment. Moreover, depending on the magnitude of the possibility, the execution unit may change the contents of a notification, or may change the electric power equipment, the power of which is to be turned off. Accordingly, when there is a possibility that the amount of received electric power will exceed the target electric power amount, a detailed countermeasure can be taken.

(9, 10) A demand monitoring method according to another embodiment of the present invention includes steps corresponding to the processing units included in the aforementioned demand monitoring device. Thus, the same operation and effects as those of the aforementioned demand monitoring device can be achieved.

(11, 12) A demand monitoring program according to another embodiment of the present invention is configured to cause a computer to function as the processing units included in the aforementioned demand monitoring device. Thus, the same operation and effects as those of the aforementioned demand monitoring device can be achieved.

(13) The demand monitoring device in (1) can also be represented as follows.

Specifically, the demand monitoring device in (1) is a demand monitoring device which monitors an amount of electric power received by a consumer and includes: a prediction unit predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(14) The demand monitoring method in (9) can also be represented as follows.

Specifically, the demand monitoring method in (9) is a demand monitoring method for monitoring an amount of electric power received by a consumer and includes: a prediction step of predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation step of creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted in the prediction step, and (iii) a target electric power amount based on contract electric power of the consumer; and a display control step of displaying the graph created in the creation step, on a screen of a display device.

(15) The demand monitoring program in (11) can also be represented as follows.

Specifically, the demand monitoring program in (11) is a demand monitoring program for monitoring an amount of electric power received by a consumer and causes a computer to function as: a prediction unit predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(16) From the viewpoint of a system, provided is a demand monitoring system which monitors an amount of electric power received by a consumer, the demand monitoring system including: a prediction unit predicting, every demand period, received electric power in the demand period on the basis of an amount of electric power received by the consumer until the current time and at least one of demand electric power of the consumer at a time previous to the demand period, electric power generated by the consumer at the previous time, electric power received by the consumer at the previous time, a known schedule of the consumer in the demand period, predicted weather information, and observed weather information; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until the current time, (ii) a predicted value for an amount of received electric power from the current time onward, the predicted value being predicted by the prediction unit, and (iii) a target electric power amount based on contract electric power of the consumer; and a display control unit displaying the graph created by the creation unit, on a screen of a display device.

(17) From another viewpoint of a system, provided is a demand monitoring system which monitors an amount of electric power received by a consumer, the demand monitoring system including: a plan calculation unit calculating a planned received electric power which is a planned value for received electric power of the consumer, by calculating an operation plan of electric power equipment on the basis of predicted demand electric power obtained by predicting demand electric power of the consumer, the electric power equipment being installed in the consumer; a creation unit creating a graph in which a first axis is an axis for a time in an object demand period which is a monitoring object demand period or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer; and a display control unit displaying the graph created by the creation unit, on a screen of a display device.

DETAILS OF EMBODIMENTS OF PRESENT INVENTION

Hereinafter, embodiments of the present invention will be described in detail with reference to the drawings. The embodiments described below each indicate a preferred specific example of the present invention. Numeric values, shapes, components, arrangement positions and connection forms of the components, steps, and order of the steps, and the like shown in the following embodiments are examples and are not intended to limit the present invention. The present invention is specified by the appended claims. Therefore, among the components in the following embodiments, components that are not recited in independent claims indicating the broadest concept of the present invention are not necessarily required to achieve the object of the present invention, but are described as forming a more preferable mode.

Embodiment 1

[1-1. Configuration of Demand Monitoring Device]

Figure 1:
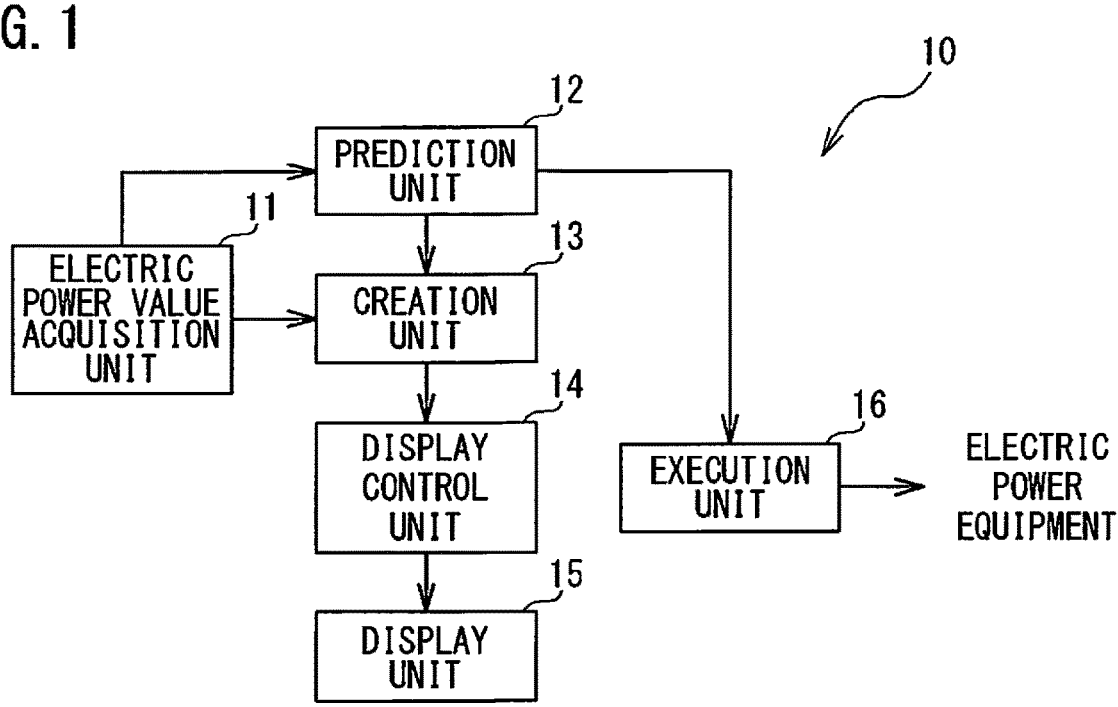
FIG. 1 is a block diagram showing the configuration of a demand monitoring device according to Embodiment 1 of the present invention.

FIG. 1 is a block diagram showing the configuration of a demand monitoring device according to Embodiment 1 of the present invention.

The demand monitoring device 10 is a device that is installed in a consumer such as a building or a factory and that performs monitoring every demand period (for example, 30 minutes) such that an amount of electric power (amount of received electric power) received by the consumer from an electric power company during the demand period does not exceed a target electric power amount. The demand monitoring device 10 can be composed of a computer system that includes a CPU (Central Processing Unit), a RAM (Random Access Memory), a ROM (Read Only Memory), and a HDD (Hard Disk Drive).

The demand monitoring device 10 includes an electric power value acquisition unit 11, a prediction unit 12, a creation unit 13, a display control unit 14, a display unit 15, and an execution unit 16. The processing units 11 to 14 and 16 are functional processing units implemented by executing a computer program on the CPU.

The electric power value acquisition unit 11 acquires a value of electric power (received electric power) received by the consumer from the electric power company. For example, the electric power value acquisition unit 11 receives a pulse outputted from a traded electric power meter, via a communication interface or the like, and calculates a value of received electric power on the basis of the received pulse.

Every demand period, the prediction unit 12 predicts received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information. That is, the prediction unit 12 predicts received electric power in each demand period by using a predetermined method for predicting received electric power. For example, the prediction unit 12 may calculate the average of received electric power on the same days of the weeks and in the same time period in the past three months as the demand period, every predetermined time (for example, 1 minute), and may set the calculated average of received electric power as predicted received electric power in the demand period.

For a consumer in which an electric power generation facility is not installed, demand electric power is received electric power. Thus, the prediction unit 12 can also predict received electric power from demand electric power. For example, the prediction unit 12 may calculate the average of demand electric power on the same days of the weeks and in the same time period in the past two months as the demand period, every predetermined time (for example, 1 minute), and may set the calculated average of demand electric power as predicted received electric power in the demand period.

For a consumer in which an electric power generation facility is installed, a value obtained by subtracting generated electric power from demand electric power is received electric power. Thus, the prediction unit 12 can also predict received electric power from demand electric power and generated electric power. For example, the prediction unit 12 may calculate the average of demand electric power and the average of generated electric power on the same days of the weeks and in the same time period in the past one month as the demand period, every predetermined time (for example, 1 minute), and may set a value obtained by subtracting the calculated average of generated electric power from the calculated average of demand electric power, as predicted received electric power in the demand period.

The prediction unit 12 may predict received electric power in a demand period on the basis of a known schedule of the consumer such as an operation plan of a factory. That is, when the operation status of electric power equipment in a demand period can be predicted from the operation plan, the prediction unit 12 can predict received electric power in the demand period from the operation status.

The prediction unit 12 may predict received electric power in a demand period by using predicted weather information such as weather forecast. For example, when a certain relationship is found between a predicted air temperature and demand electric power of an air-conditioner, the prediction unit 12 can predict demand electric power from the predicted air temperature and predict received electric power on the basis of the demand electric power.

The prediction unit 12 may predict received electric power in a demand period by using weather information observed with an air temperature meter or the like. For example, when a certain relationship is found between the air temperature and demand electric power of an air-conditioner, the prediction unit 12 can predict demand electric power from the observed air temperature and predict received electric power on the basis of the demand electric power.

The method for predicting received electric power may be a method other than the above-described methods, as long as the method is a method for predicting received electric power without using received electric power of the consumer in a demand period that is set as an object for prediction.

Figure 2:
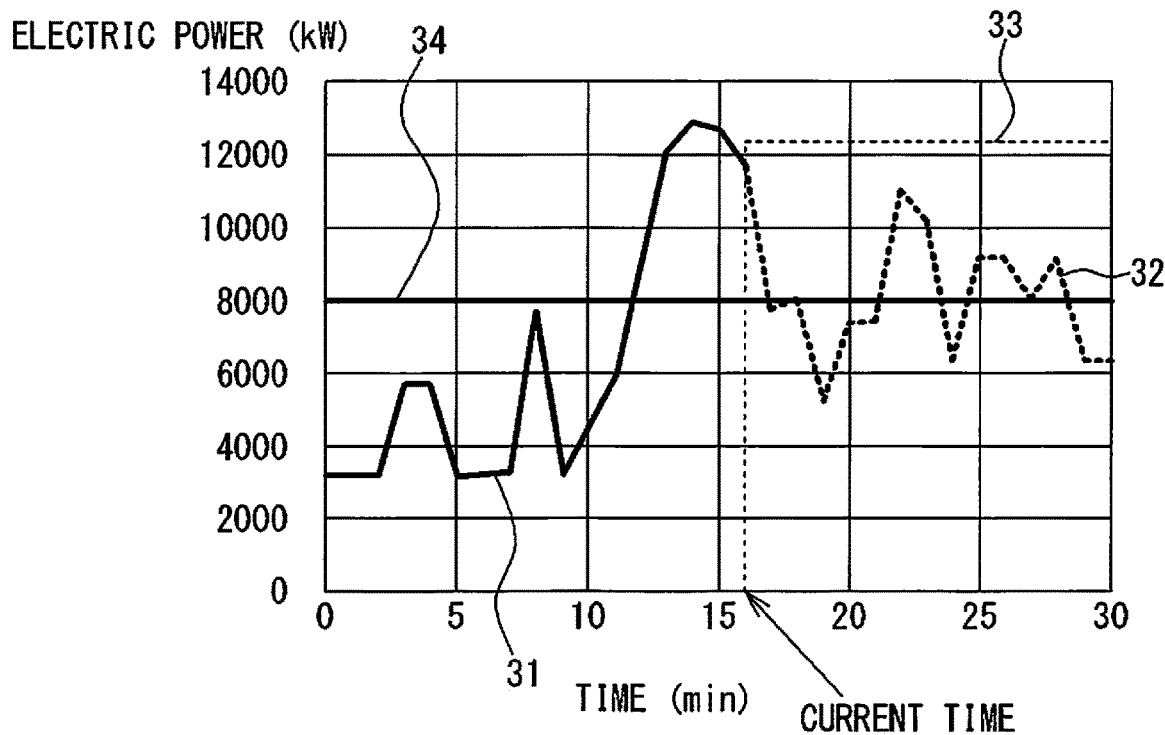
FIG. 2 is a graph showing received electric power predicted by a prediction unit.

FIG. 2 is a graph showing received electric power predicted by the prediction unit 12 (hereinafter, referred to as "predicted received electric power"). In the graph shown in FIG. 2, the horizontal axis indicates a time in a demand period, and the vertical axis indicates electric power. In addition, the current time is assumed to be, for example, a time after 15 minutes from the start of the demand period. Received electric power 31 shown on the graph is an actual value of electric power received from the electric power company from the start time (0 minutes) of the demand period to the current time. That is, the received electric power 31 is an actual value of received electric power acquired by the electric power value acquisition unit 11. In addition, predicted received electric power 32, predicted by the prediction unit 12, from the current time to the end time (30 minutes) of the demand period is shown on the graph. Furthermore, predicted received electric power 33 predicted by the conventional method shown by Equation 1 is shown on the graph. As seen from comparison between the predicted received electric power 32 and the predicted received electric power 33, the predicted received electric power 32 predicted by the prediction unit 12 is a value changing with passage of time, but the predicted received electric power 33 predicted by the conventional method is a constant value. In addition, target electric power 34 set on the basis of contract electric power that is contracted between the consumer and the electric power company is shown on the graph. The target electric power 34 may be the same value as the contract electric power, or may be a value lower or higher than the contract electric power by predetermined electric power.

Figure 3:
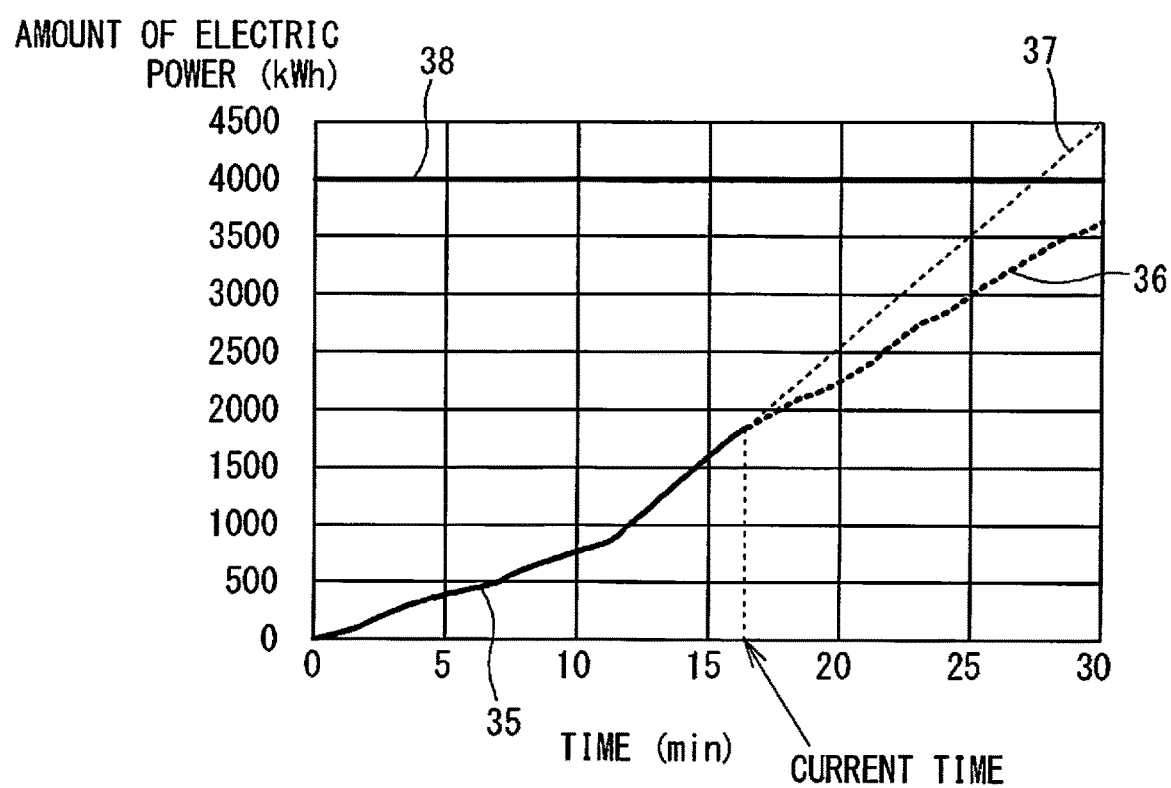
FIG. 3 is a diagram showing an example of a graph created by a creation unit.

The creation unit 13 creates a graph showing a relationship among an amount of electric power received by the consumer from the electric power company, a predicted value for an amount of received electric power, and a target electric power amount. Hereinafter, a more detailed description will be given with specific examples of the graph. FIG. 3 is a diagram showing an example of a graph created by the creation unit 13. In the graph shown in FIG. 3, the horizontal axis indicates a time in an object demand period that is a monitoring object demand period (a demand period to which the current time belongs), and the vertical axis indicates an electric power amount. In addition, similar to the graph shown in FIG. 2, the current time is assumed to be, for example, a time after 15 minutes from the start of the demand period. On the graph, a received electric power amount 35, a predicted received electric power amount 36, a predicted received electric power amount 37, and a target electric power amount 38 are shown. The received electric power amount 35 indicates an amount of electric power received by the consumer until the current time. The received electric power amount 35 is calculated on the basis of an actual value of received electric power acquired by the electric power value acquisition unit 11 (the received electric power 31 shown on the graph in FIG. 2). The predicted received electric power amount 36 indicates a predicted value for an amount of electric power received from the electric power company from the current time to the end of the object demand period. That is, the predicted received electric power amount 36 is calculated by adding a predicted received electric power amount from the current time onward calculated on the basis of the predicted received electric power 32 predicted by the prediction unit 12, to the amount of electric power received by the consumer at the current time. Accordingly, the received electric power amount 35 and the predicted received electric power amount 36 are connected to each other to form a line. The electric power amount is calculated by integrating electric power by time. The predicted received electric power amount 37 indicates a predicted value, according to the conventional prediction method, for an amount of electric power received from the electric power company from the current time to the end of the object demand period. That is, the predicted received electric power amount 37 is calculated by adding a predicted received electric power amount from the current time onward calculated on the basis of the predicted received electric power 33 predicted by the conventional method, to the amount of electric power received by the consumer at the current time. Accordingly, the received electric power amount 35 and the predicted received electric power amount 37 are connected to each other to form a line. The target electric power amount 38 is obtained by multiplying the target electric power 34 by the length of the object demand period (here, 0.5 hour).

The display control unit 14 performs control in which the graph created by the creation unit 13 is displayed on the screen of the display unit 15. For example, the display control unit 14 causes the graph to be displayed on the screen of the display unit 15 by outputting image data of the graph as shown in FIG. 3 to the display unit 15.

The display unit 15 is, for example, a display device such as a liquid crystal display device, and receives the image data of the graph from the display control unit 14 and displays the received image data on the screen.

The execution unit 16 executes at least either notification to the manager of the consumer or control of the electric power equipment installed in the consumer, on the basis of the relationship between the predicted received electric power amount 36 from the current time onward and the target electric power amount 38. For example, when the predicted received electric power amount 36 at the end of the object demand period is larger than the target electric power amount 38, the execution unit 16 provides a notification that the predicted received electric power amount 36 is likely to exceed the target electric power amount 38, by sending an E-mail to an E-mail address of the manager, automatically turns off the power of the electric power equipment, or changes the set temperature of an air-conditioner that is the electric power equipment. Accordingly, the predicted received electric power amount 36 can be prevented from exceeding the target electric power amount 38 in advance.

The electric power equipment includes a non-adjustable type load apparatus for which electric power adjustment is impossible or is possible but is not permitted in actuality, such as a production machine. In addition, the electric power equipment may include an adjustable type load apparatus whose power consumption is adjustable, such as lighting and an air-conditioner.

[1-2. Process Flow of Demand Monitoring Device 10]

Figure 4:
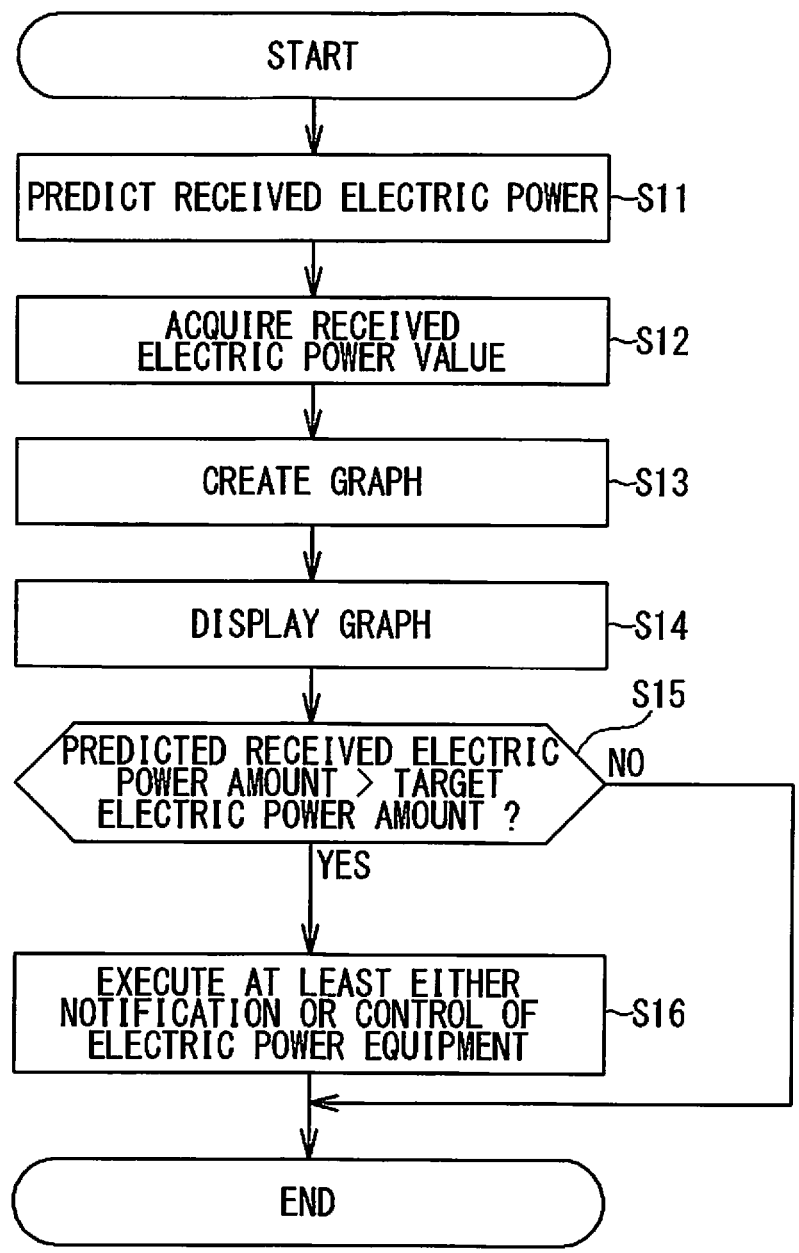
FIG. 4 is a flowchart showing flow of a process executed by the demand monitoring device according to Embodiment 1 of the present invention.

FIG. 4 is a flowchart showing flow of a process executed by the demand monitoring device 10 according to Embodiment 1 of the present invention.

Every demand period, the prediction unit 12 predicts received electric power in the demand period, by using a predetermined method for predicting received electric power, on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information (S11). Accordingly, for example, the predicted received electric power 32 as shown in FIG. 2 can be predicted. The prediction unit 12 may collectively predict received electric power for a predetermined period (for example, 24 hours) in advance. That is, the process in step S11 can be performed independently of processes in and after step S12.

The electric power value acquisition unit 11 acquires a value of electric power received by the consumer from the electric power company (S12). Accordingly, for example, a value of the received electric power 31 as shown in FIG. 2 can be acquired.

The creation unit 13 creates a graph showing a relationship among a received electric power amount 35 from the electric power company from the start of the object demand period to the current time, a predicted received electric power amount 36 from the current time to the end of the object demand period, and a target electric power amount 38 (S13). For example, the creation unit 13 creates the graph as shown in FIG. 3. The creation unit 13 updates the graph as shown in FIG. 3 with passage of the current time. When the current time has reached the end time of the object demand period, the creation unit 13 updates the object demand period and creates a new graph again.

The display control unit 14 performs control in which the graph created by the creation unit 13 is displayed on the screen of the display unit 15 (S14). Accordingly, for example, the graph as shown in FIG. 3 is displayed on the screen of the display unit 15.

The execution unit 16 determines whether the predicted received electric power amount 36 at the end of the object demand period is larger than the target electric power amount 38 (S15). For example, in the graph shown in FIG. 3, the predicted received electric power amount 36 at the end of the object demand period (30 minutes) is smaller than the target electric power amount 38.

When the predicted received electric power amount 36 at the end of the object demand period is larger than the target electric power amount 38 (YES in S15), the execution unit 16 provides a notification that the predicted received electric power amount 37 is likely to exceed the target electric power amount 38, by sending an E-mail to the E-mail address of the manager, automatically turns off the power of predetermined electric power equipment, or changes the set temperature of an air-conditioner that is the electric power equipment (S16).

The demand monitoring device 10 repeatedly executes the processes in steps S12 to S16 at predetermined time intervals (for example, intervals of 1 minute).

[1-3. Advantageous Effects of Embodiment 1, Etc.]

As described above, according to Embodiment 1 of the present invention, the prediction unit 12 predicts received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information. Thus, even when electric power is temporarily and excessively consumed in the demand period so that the received electric power temporarily becomes large, the prediction unit 12 can predict received electric power regardless of the large received electric power. For example, the prediction unit 12 can predict received electric power in a demand period by using a statistical prediction method on the basis of received electric power on the same dates of the weeks and in the same time period in a past predetermined period as the demand period. The predicted received electric power amount 36 shown on the graph shown in FIG. 3 is calculated on the basis of the received electric power predicted by the prediction unit 12. Thus, even when the received electric power amount 35 temporarily becomes large in the demand period, the predicted received electric power amount 36 does not exceed the target electric power amount 38 each time the received electric power amount 35 becomes large, and the predicted received electric power amount 36 can be accurately shown on the graph. Therefore, the manager can predict whether the amount of received electric power at the end of the demand period will exceed the target electric power amount 38, with high accuracy. Accordingly, the necessity for the manager to unnecessarily take a countermeasure for reducing the amount of received electric power is eliminated.

In the conventional demand monitoring device, a period within a predetermined time from the start of a demand period is set as a period in which a notification process or control of electric power equipment is not performed. This is because, even when the amount of received electric power at the end of the demand period is predicted to exceed the target electric power amount 38 within the period, the accuracy of the prediction is poor and there is a high possibility that the amount of received electric power finally becomes equal to or less than the target electric power amount 38. However, according to the demand monitoring device 10 of Embodiment 1, the prediction unit 12 predicts received electric power by the statistical method, and thus the accuracy of prediction of received electric power from the start of the demand period is high. Therefore, whether the amount of received electric power at the end of the demand period will exceed the target electric power amount 38 can be predicted from the start of the demand period. Accordingly, the execution unit 16 or the manager can take a required countermeasure at an early stage.

Figure 5:
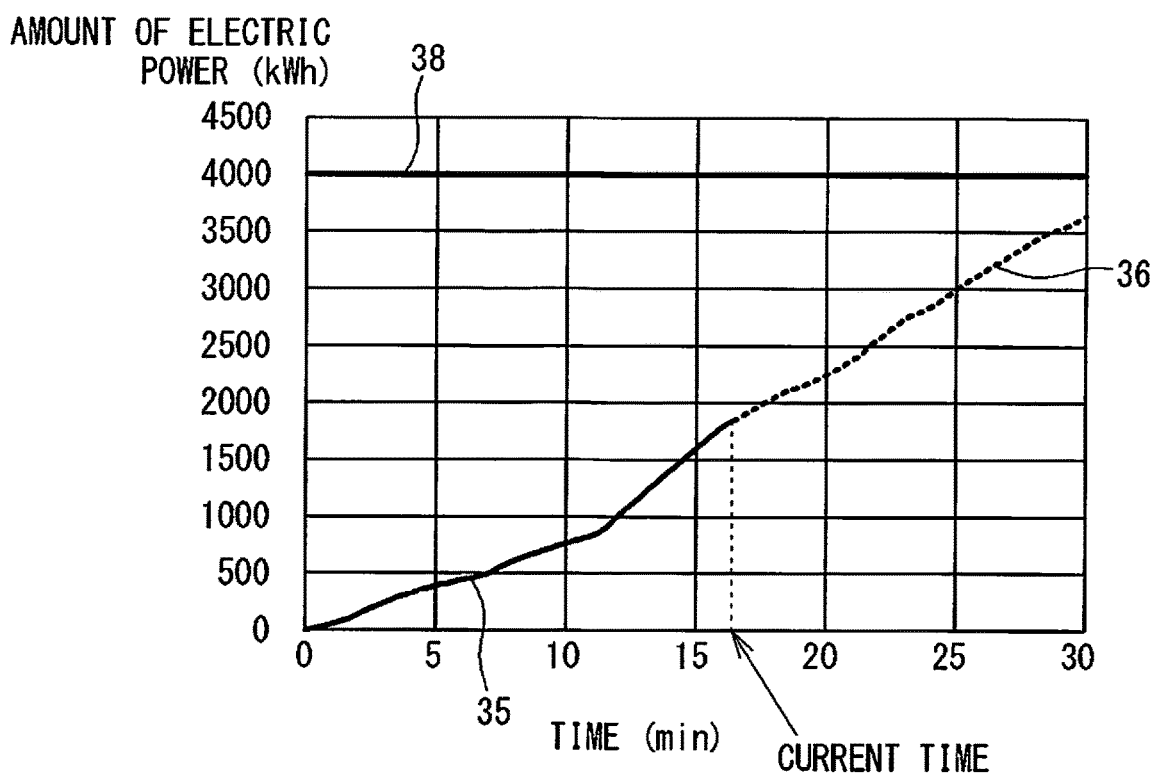
FIG. 5 is a diagram showing an example of a graph created by the creation unit.

On the graph shown in FIG. 3, it is not essential to show the predicted received electric power amount 37. That is, as shown in FIG. 5, the received electric power amount 35, the predicted received electric power amount 36, and the target electric power amount 38 only need to be shown on a graph, and the predicted received electric power amount 37 may not be shown thereon.

Embodiment 2

In Embodiment 1, whether an amount of received electric power will exceed a target electric power amount is determined on the basis of predicted received electric power. In Embodiment 2, an example in which whether an amount of received electric power will exceed a target electric power amount is determined on the basis of planned received electric power, will be described. In the following description, the same components as those in Embodiment 1 are designated by the same reference signs, and the description thereof is omitted as appropriate.

[2-1. Configuration of Demand Monitoring Device]

Figure 6:
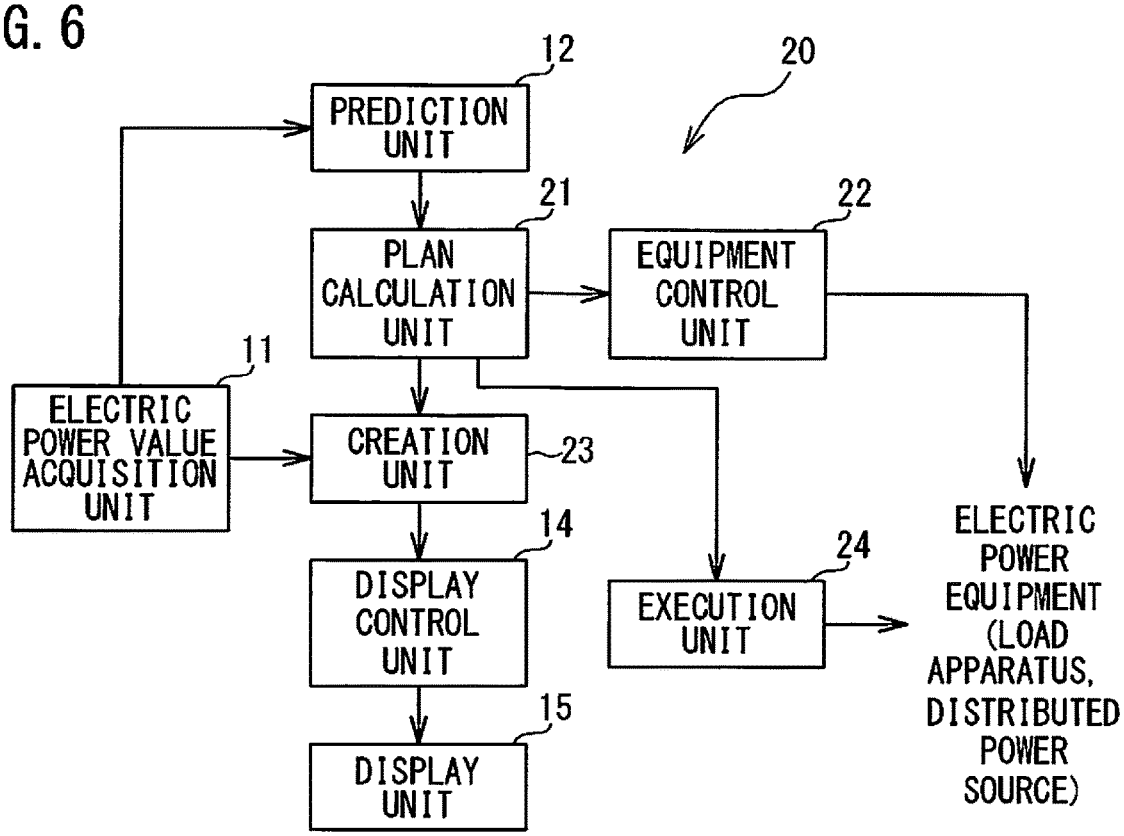
FIG. 6 is a block diagram showing the configuration of a demand monitoring device according to Embodiment 2 of the present invention.

FIG. 6 is a block diagram showing the configuration of a demand monitoring device according to Embodiment 2 of the present invention.

The demand monitoring device 20 is a device that is installed in a consumer such as a building or a factory and that performs monitoring every demand period (for example, 30 minutes) such that an amount of electric power (amount of received electric power) received by the consumer from an electric power company during the demand period does not exceed a target electric power amount. In addition, the demand monitoring device 20 has a function of an EMS to: calculate an operation plan of electric power equipment installed in the consumer; and control operation of the electric power equipment in accordance with the calculated operation plan. The demand monitoring device 20 can be composed of a computer system that includes a CPU, a RAM, a ROM, and a HDD.

Similar to Embodiment 1, the electric power equipment installed in the consumer includes a non-adjustable type or adjustable type load apparatus. In addition, in Embodiment 2, the electric power equipment includes a distributed power source such as an electric power generation apparatus or a power storage apparatus.

Examples of the electric power generation device include electric power generation devices that convert combustion energy of gas, diesel fuel, or the like, or energy generated through chemical change by a fuel cell or the like, to electrical energy. In addition, the electric power generation devices may include a solar electric power generation device which converts solar energy to electric power.

Examples of the power storage device include secondary batteries such as a redox-flow (RF) battery, a lithium ion battery, a molten salt battery, and a lead storage battery. A flywheel battery, a pumped-storage generator, or the like may be used instead of these secondary batteries.

The demand monitoring device 20 includes an electric power value acquisition unit 11, a prediction unit 12, a plan calculation unit 21, an equipment control unit 22, a creation unit 23, a display control unit 14, a display unit 15, and an execution unit 24. The processing units 11, 12, 14, and 21 to 24 are functional processing units implemented by executing a computer program on the CPU.

Similar to Embodiment 1, the electric power value acquisition unit 11 acquires a value of electric power received by the consumer from an electric power company, on the basis of a pulse or the like received from a traded electric power meter.

Every demand period, the prediction unit 12 predicts electric power (demand electric power) consumed by a load apparatus installed in the consumer in the demand period. The demand electric power can be predicted by a predetermined method for predicting demand electric power. For example, the prediction unit 12 may calculate the average of demand electric power on the same days of the weeks and in the same time period in the past three months as the demand period, every predetermined time (for example, 1 minute), and may set the calculated average of demand electric power as predicted demand electric power in the demand period. The method for predicting demand electric power may be a method other than the above-described methods, as long as the method is a method for predicting demand electric power without using demand electric power of the consumer in a demand period that is set as an object for prediction. For example, similar to the prediction unit 12 described in Embodiment 1, the demand electric power of the consumer may be predicted by using a known schedule of the consumer, predicted weather information such as weather forecast, or weather information observed with an air temperature meter or the like.

The plan calculation unit 21 calculates an operation plan of the electric power equipment installed in the consumer, on the basis of predicted demand electric power that is obtained by the prediction unit 12 predicting the demand electric power of the consumer. A predetermined method can be used as the method for calculating an operation plan. For example, the plan calculation unit 21 calculates an operation plan of the electric power equipment by solving an optimization problem that a value of an objective function indicating cost is minimized, under constraint conditions that the load apparatus consumes the predicted demand electric power and the electric power received from the electric power company does not exceed a target electric power. The optimization problem can be formulated by using linear programming or the like. The operation statuses of the load apparatus and the distributed power source are determined by calculating an operation plan of the electric power equipment. That is, when the demand electric power of the load apparatus exceeds the target electric power, an operation status is determined such that the distributed power source performs electric power generation, electrical discharge, or the like to output electric power. Accordingly, the plan calculation unit 21 calculates planned received electric power that is a planned value for received electric power of the consumer. In addition, the plan calculation unit 21 calculates output electric power that is to be outputted by the distributed power source through electric power generation, electrical discharge, or the like. The method for calculating an operation plan of the electric power equipment is not limited to the above-described method.

Figure 7:
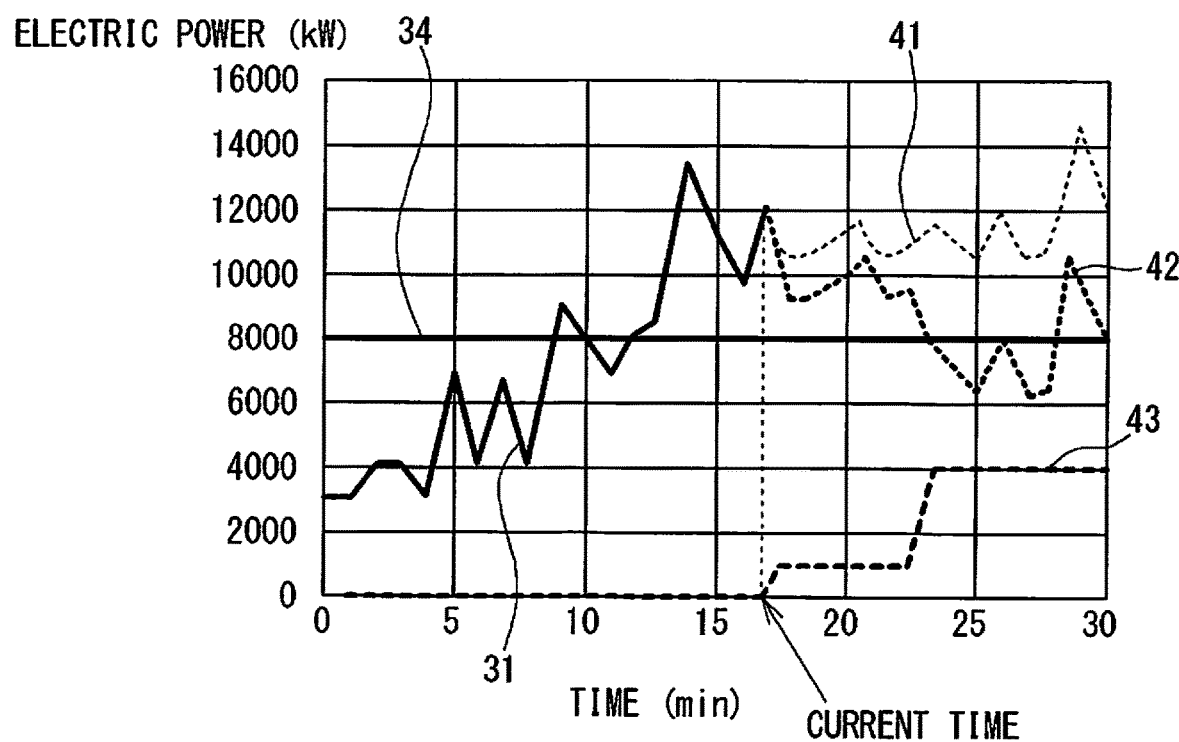
FIG. 7 is a graph showing planned received electric power and output electric power calculated by a plan calculation unit.

FIG. 7 is a graph showing the planned received electric power and the output electric power calculated by the plan calculation unit 21. In the graph shown in FIG. 7, the horizontal axis indicates a time in a demand period, and the vertical axis indicates electric power. In addition, the current time is assumed to be, for example, a time after 15 minutes from the start of the demand period. Received electric power 31 shown on the graph is an actual value of electric power received from the electric power company from the start time (0 minute) of the demand period to the current time. That is, the received electric power 31 is an actual value of received electric power acquired by the electric power value acquisition unit 11. In addition, predicted demand electric power 41, predicted by the prediction unit 12, from the current time to the end time (30 minutes) of the demand period is shown on the graph. Furthermore, planned received electric power 42 and output electric power 43, calculated by the plan calculation unit 21, from the current time to the end time (30 minutes) of the demand period are shown on the graph. In addition, target electric power 34 set on the basis of contract electric power that is contracted between the consumer and the electric power company is shown on the graph. The target electric power 34 may be the same value as the contract electric power, or may be a value lower or higher than the contract electric power by predetermined electric power.

As seen from the graph shown in FIG. 7, a state where the predicted demand electric power 41 exceeds the target electric power 34 continues from the current time onward, and thus control is performed such that the distributed power source outputs electric power to decrease the received electric power. Thus, it is planned that the output electric power 43 becomes positive from the current time onward and accordingly the planned received electric power 42 becomes lower than the predicted demand electric power 41.

The equipment control unit 22 controls the electric power equipment, which includes the load apparatus and the distributed power source, in accordance with the operation plan of the electric power equipment calculated by the plan calculation unit 21.

Figure 8:
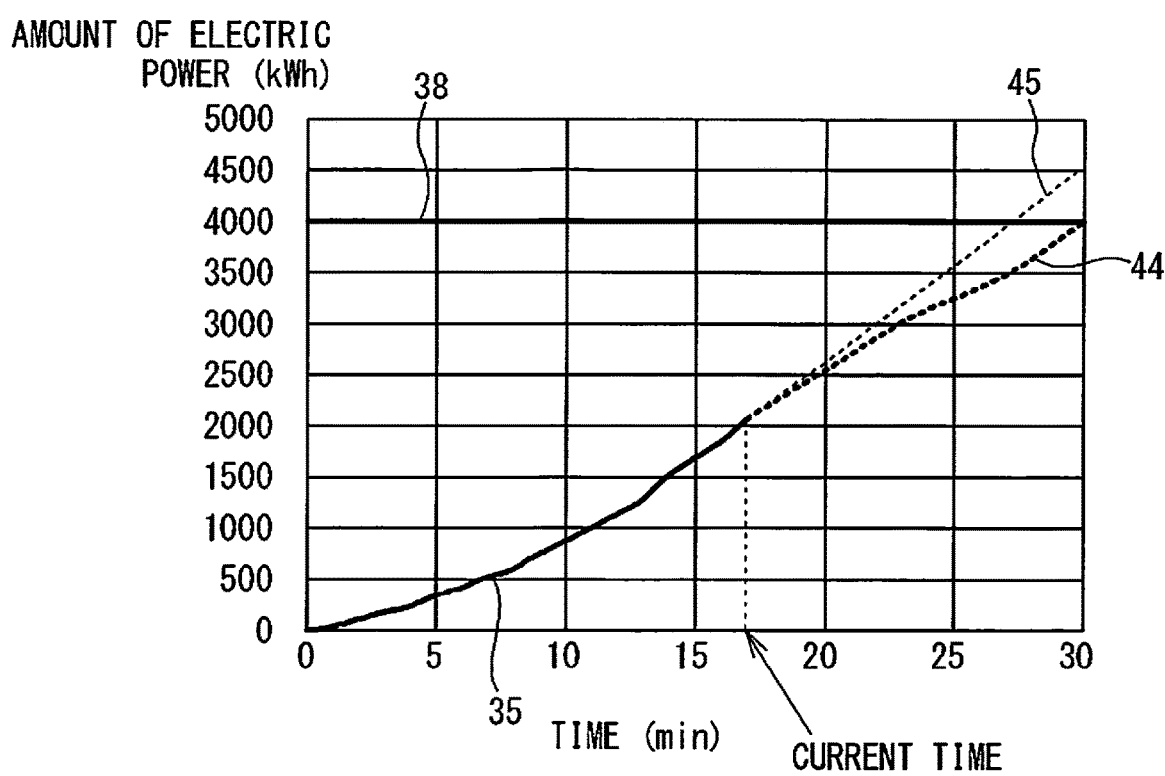
FIG. 8 is a diagram showing an example of a graph created by a creation unit.

The creation unit 23 creates a graph showing a relationship among an amount of electric power received by the consumer from the electric power company, a planned value for an amount of received electric power, a predicted value for a demand electric power amount, and a target electric power amount. Hereinafter, a more detailed description will be given with specific examples of the graph. FIG. 8 is a diagram showing an example of a graph created by the creation unit 23. In the graph shown in FIG. 8, the horizontal axis indicates a time in an object demand period, and the vertical axis indicates an electric power amount. In addition, similar to the graph shown in FIG. 7, the current time is assumed to be, for example, a time after 15 minutes from the start of the demand period. On the graph, a received electric power amount 35, a planned received electric power amount 44, a predicted demand electric power amount 45, and a target electric power amount 38 are shown. The received electric power amount 35 indicates an amount of electric power received by the consumer until the current time. The received electric power amount 35 is calculated on the basis of an actual value of received electric power acquired by the electric power value acquisition unit 11 (the received electric power 31 shown on the graph in FIG. 7). The planned received electric power amount 44 is a planned value for an amount of received electric power calculated on the basis of the planned received electric power, from the current time onward, calculated by the plan calculation unit 21. The predicted demand electric power amount 45 is a planned value for a demand electric power amount calculated on the basis of the predicted demand electric power 41, from the current time onward, predicted by the prediction unit 12. The target electric power amount 38 is obtained by multiplying the target electric power 34 by the length of the object demand period (here, 0.5 hour).

The planned received electric power amount 44 is calculated by adding a planned value for an amount of received electric power, from the current time onward, calculated on the basis of the planned received electric power 42 planned by the plan calculation unit 21, to the received electric power amount 35 of the consumer at the current time. Accordingly, the received electric power amount 35 and the planned received electric power amount 44 are connected to each other to form a line. Similarly, the predicted demand electric power amount 45 is calculated by adding a predicted value for demand electric power, from the current time onward, calculated on the basis of the predicted demand electric power 41 predicted by the prediction unit 12, to the received electric power amount 35 of the consumer at the current time.

The display control unit 14 performs control in which the graph created by the creation unit 23 is displayed on the screen of the display unit 15. For example, the display control unit 14 causes the graph to be displayed on the screen of the display unit 15 by outputting image data of the graph as shown in FIG. 8 to the display unit 15.

The display unit 15 is, for example, a display device such as a liquid crystal display device, and receives the image data of the graph from the display control unit 14 and displays the received image data on the screen.

The execution unit 24 executes at least either notification to the manager of the consumer or control of the electric power equipment installed in the consumer, on the basis of the relationship between the planned received electric power amount 44 from the current time onward and the target electric power amount 38. For example, when the planned received electric power amount 44 at the end of the object demand period is larger than the target electric power amount 38, the execution unit 16 provides a notification that the planned received electric power amount 44 is likely to exceed the target electric power amount 38, by sending an E-mail to an E-mail address of the manager, automatically turns off the power of the electric power equipment, or changes the set temperature of an air-conditioner that is the electric power equipment. Accordingly, the planned received electric power amount 44 can be prevented in advance from exceeding the target electric power amount 38.

[2-2. Process Flow of Demand Monitoring Device 20]

Figure 9:
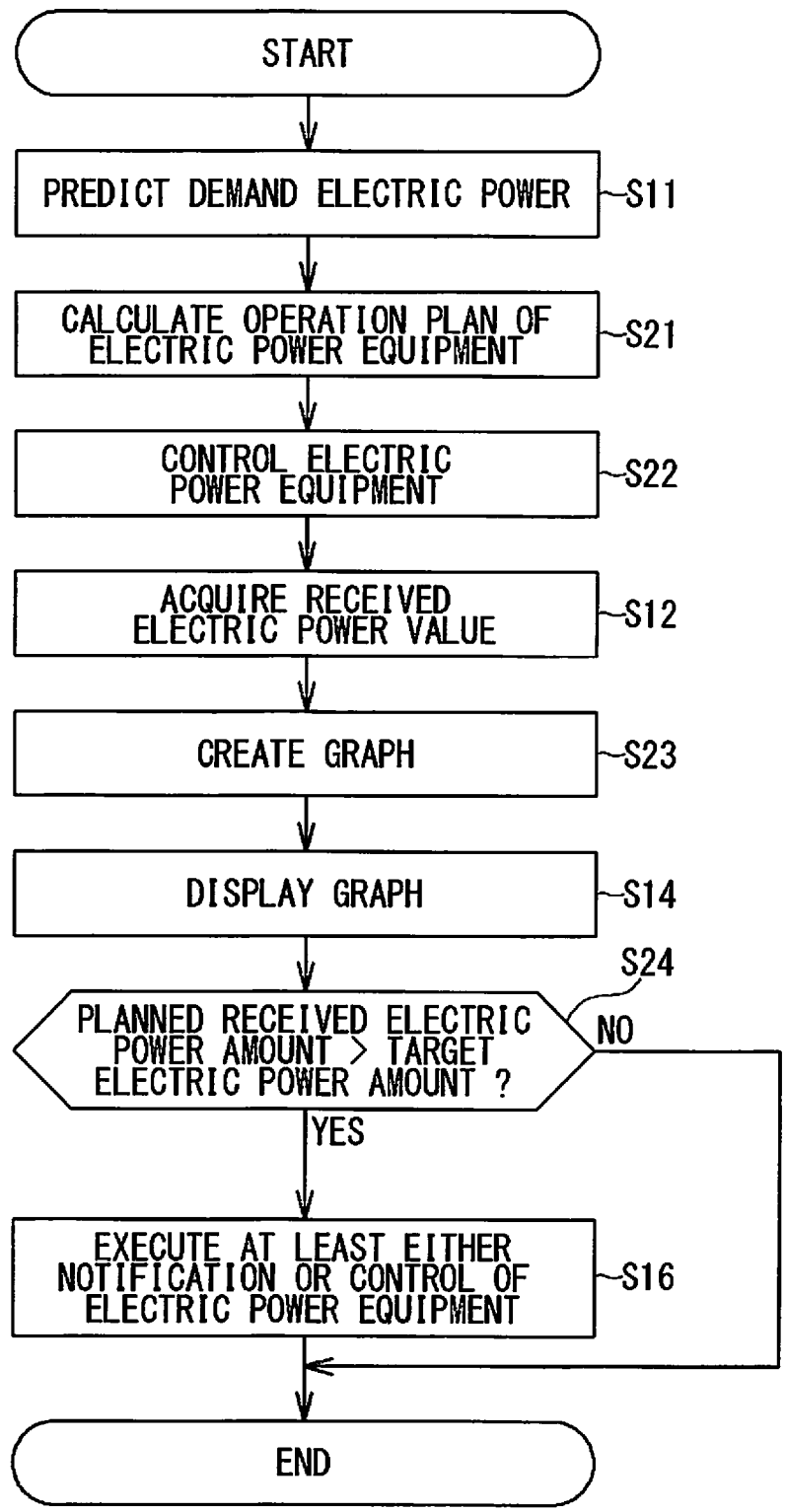
FIG. 9 is a flowchart showing flow of a process executed by the demand monitoring device according to Embodiment 2 of the present invention.

FIG. 9 is a flowchart showing flow of a process executed by the demand monitoring device 20 according to Embodiment 2 of the present invention.

A received electric power prediction process (S11) is the same as in Embodiment 1.

The plan calculation unit 21 calculates an operation plan of the electric power equipment, which is installed in the consumer, on the basis of the predicted demand electric power predicted by the prediction unit 12 (S21).

The equipment control unit 22 controls the electric power equipment, which includes the load apparatus and the distributed power source, in accordance with the operation plan of the electric power equipment calculated by the plan calculation unit 21 (S22). The processes in steps S11, S21, and S22 can be performed independently of processes in and after step S12.

The electric power value acquisition unit 11 acquires a value of electric power received by the consumer from the electric power company (S12). Accordingly, for example, a value of the received electric power 31 as shown in FIG. 7 can be acquired.

The creation unit 23 creates a graph showing a relationship between an amount of electric power received by the consumer from the electric power company, a planned value for an amount of received electric power, a predicted value for a demand electric power amount, and a target electric power amount (S23). For example, the creation unit 13 creates the graph as shown in FIG. 8. The creation unit 23 updates the graph as shown in FIG. 8 with passage of the current time. When the current time has reached the end time of the object demand period, the creation unit 23 updates the object demand period and creates a new graph again.

The display control unit 14 performs control in which the graph created by the creation unit 23 is displayed on the screen of the display unit 15 (S14). Accordingly, for example, the graph as shown in FIG. 8 is displayed on the screen of the display unit 15.

The execution unit 24 determines whether the planned received electric power amount 44 at the end of the object demand period is larger than the target electric power amount 38 (S24). For example, in the graph shown in FIG. 8, the planned received electric power amount 44 at the end of the object demand period (30 minutes) is equal to the target electric power amount 38.

When the planned received electric power amount 44 at the end of the object demand period is larger than the target electric power amount 38 (YES in S24), the execution unit 24 executes at least either a process of notification to the manager or a process of control of the electric power equipment, similar to Embodiment 1 (S16).

The demand monitoring device 20 repeatedly executes the processes in steps S12 to S16 at predetermined time intervals (for example, intervals of 1 minute).

[2-3. Advantageous Effects of Embodiment 2, Etc.]

As described above, according to Embodiment 2 of the present invention, the planned received electric power 42 is calculated by calculating an operation plan of the electric power equipment. When the electric power equipment has been operated as per the operation plan, the received electric power is as indicated by the planned received electric power 42. Thus, by looking at the graph on which the planned received electric power amount 44 is shown, the manager can predict whether the amount of received electric power at the end of the demand period will exceed the target electric power amount 38, with high accuracy. Accordingly, the necessity for the manager to unnecessarily take a countermeasure for reducing the amount of received electric power is eliminated. Since the plan calculation unit 21 calculates an operation plan of the electric power equipment such that an amount of received electric power will not exceed the target electric power amount 38, the amount of received electric power does not exceed the target electric power amount 38 as long as the electric power equipment is operated as per the operation plan. As described above, since the demand monitoring device 20 has the function of an EMS, electric power received from the electric power company can be controlled such that the amount of received electric power does not exceed the target electric power amount 38.

The planned received electric power amount 44 from the current time onward shown on the graph is calculated by adding a planned received electric power amount from the current time onward calculated on the basis of the planned received electric power 42 planned by the plan calculation unit 21, to the received electric power amount 35 of the consumer at the current time. That is, when the electric power equipment has not been operated as per the operation plan, the received electric power amount 35 at the current time deviates from the plan, but the planned received electric power 42 from the current time onward can be calculated in consideration of such a deviation. Thus, by looking at the graph, the manager can predict whether the amount of received electric power at the end of the demand period will exceed the target electric power amount 38, with high accuracy, even when the received electric power amount 35 deviates from a planned value. When the amount of received electric power is likely to exceed the target electric power amount 38, the manager can take a required countermeasure such as turning off the power of the electric power equipment.

As described in Embodiment 1 as well, a period within a predetermined time from the start of a demand period is set as a period in which a notification process or control of electric power equipment is not performed. However, according to the demand monitoring device 20 of Embodiment 2, the plan calculation unit 21 can plan in advance electric power received from the electric power company. Therefore, whether the amount of received electric power at the end of the demand period will exceed the target electric power amount 38 can be predicted from the start of the demand period. Accordingly, the execution unit 24 or the manager can take a required countermeasure at an early stage.

The plan calculation unit 21 also calculates an operation plan of the distributed power source when calculating an operation plan of the electric power equipment. Thus, the creation unit 23 can create a graph showing the planned received electric power amount 44 for which an amount of electric power generated by the distributed power source is taken into consideration.

The creation unit 23 can show the predicted demand electric power amount 45 corresponding to the predicted demand electric power 41, on the graph. Thus, by visually comparing the planned received electric power amount 44 and the predicted demand electric power amount 45 with each other, the manager can know the amount of electric power generated by the distributed power source. That is, a value obtained by subtracting the planned received electric power amount 44 from the predicted demand electric power amount 45 is the amount of electric power generated by the distributed power source. It is noted, however, that it is not essential to show the predicted demand electric power amount 45 on the graph. That is, the received electric power amount 35, the planned received electric power amount 44, and the target electric power amount 38 only need to be shown on the graph shown in FIG. 8, and the predicted demand electric power amount 45 may not be shown thereon.

3. Additional notes

Although the demand monitoring devices according to the embodiments of the present invention have been described above, the present invention is not limited to the embodiments.

For example, in Embodiment 1, every demand period, the prediction unit 12 predicts received electric power in the demand period on the basis of at least one of demand electric power of the consumer at a time previous to the demand period, electric power generated by the consumer at the previous time, electric power received by the consumer at the previous time, a known schedule of the consumer in the demand period, predicted weather information, and observed weather information. The prediction unit 12 may further predict received electric power in a demand period by using an actual value of electric power in the demand period.

That is, every demand period, the prediction unit 12 predicts received electric power in the demand period on the basis of: at least one of demand electric power of the consumer at a time previous to the demand period, electric power generated by the consumer at the previous time, electric power received by the consumer at the previous time, a known schedule of the consumer in the demand period, predicted weather information, and observed weather information; and at least one of demand electric power of the consumer in the demand period, electric power generated by the consumer in the demand period, and electric power received by the consumer in the demand period.

For example, when the difference between a predicted value for received electric power, in a demand period that is focused (a focused demand period), calculated on the basis of the electric power received by the consumer at a time previous to the focused demand period and an actual value of received electric power in the focused demand period becomes equal to or greater than a predetermined value, the prediction unit 12 corrects the predicted value for received electric power by increasing or decreasing the predicted value for received electric power by the difference such that the predicted value for received electric power coincides with the actual value of received electric power. Accordingly, even when the predicted value for received electric power greatly deviates from the actual value of received electric power, received electric power can be accurately predicted again.

In Embodiment 1, the prediction unit 12 predicts received electric power in an object demand period, and may use a plurality of prediction methods as the prediction method for predicting received electric power. Various methods can be used as each prediction method. In this case, the creation unit 13 creates a graph showing a predicted received electric power amount from the current time onward for each prediction method.

Figure 10:
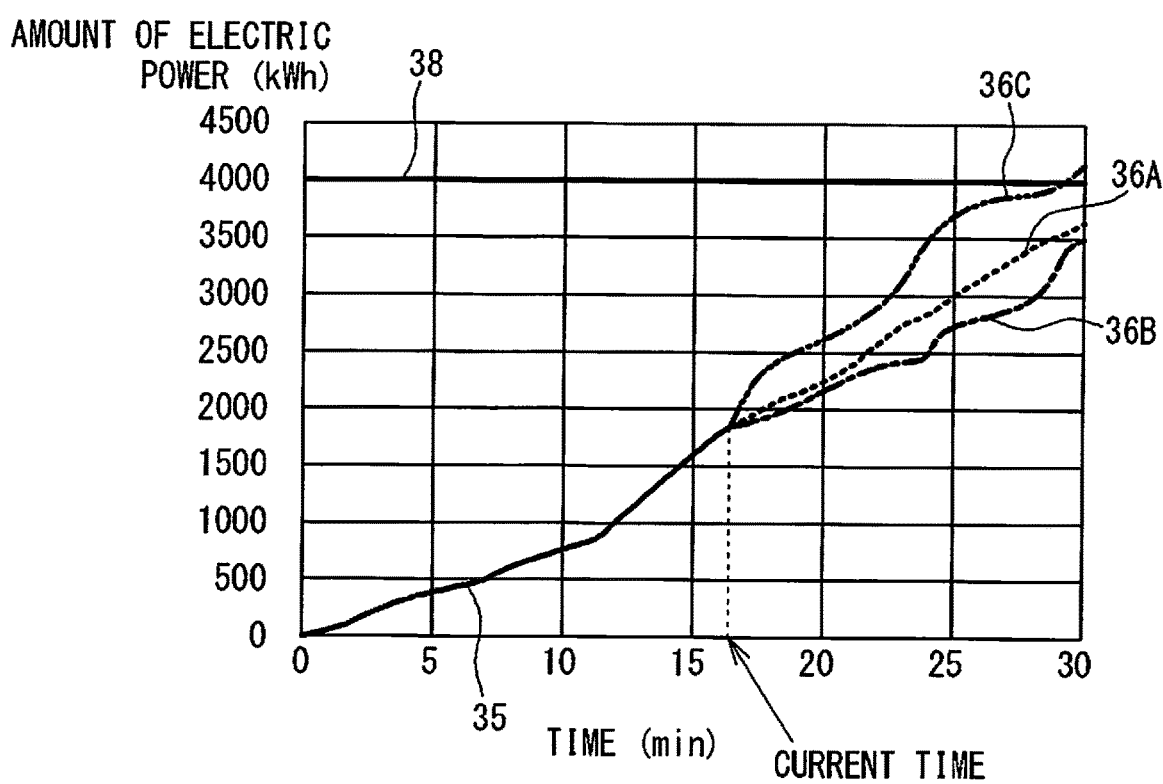
FIG. 10 is a diagram showing an example of a graph created by the creation unit.

FIG. 10 is a diagram showing an example of a graph created by the creation unit 13. On the graph, a received electric power amount 35 of the consumer from the electric power company, predicted received electric power amounts 36A to 36C, and a target electric power amount 38 are shown. The predicted received electric power amounts 36A to 36C are calculated on the basis of a plurality of (here, three) received electric powers predicted by the prediction unit 12. Similar to the predicted received electric power amount 36 shown in FIG. 3, the predicted received electric power amounts 36A to 36C are calculated on the basis of the received electric power amount 35 and the respective predicted received electric powers predicted by the prediction unit 12.

Since the plurality of predicted received electric power amounts 36A to 36C are shown on the graph, the manager can know relationships between the plurality of received electric power amounts and the target electric power amount and can predict whether the amount of electric power received from the electric power company will exceed the target electric power amount 38, with higher accuracy. For example, when even at least one of the plurality of predicted received electric power amounts 36A to 36C exceeds the target electric power amount 38, the manager may take a countermeasure for reducing the amount of received electric power, at that time. Accordingly, the manager can predict whether the amount of received electric power will exceed the target electric power amount 38, with high accuracy as compared to the case where one predicted received electric power amount is displayed.

Figure 11:
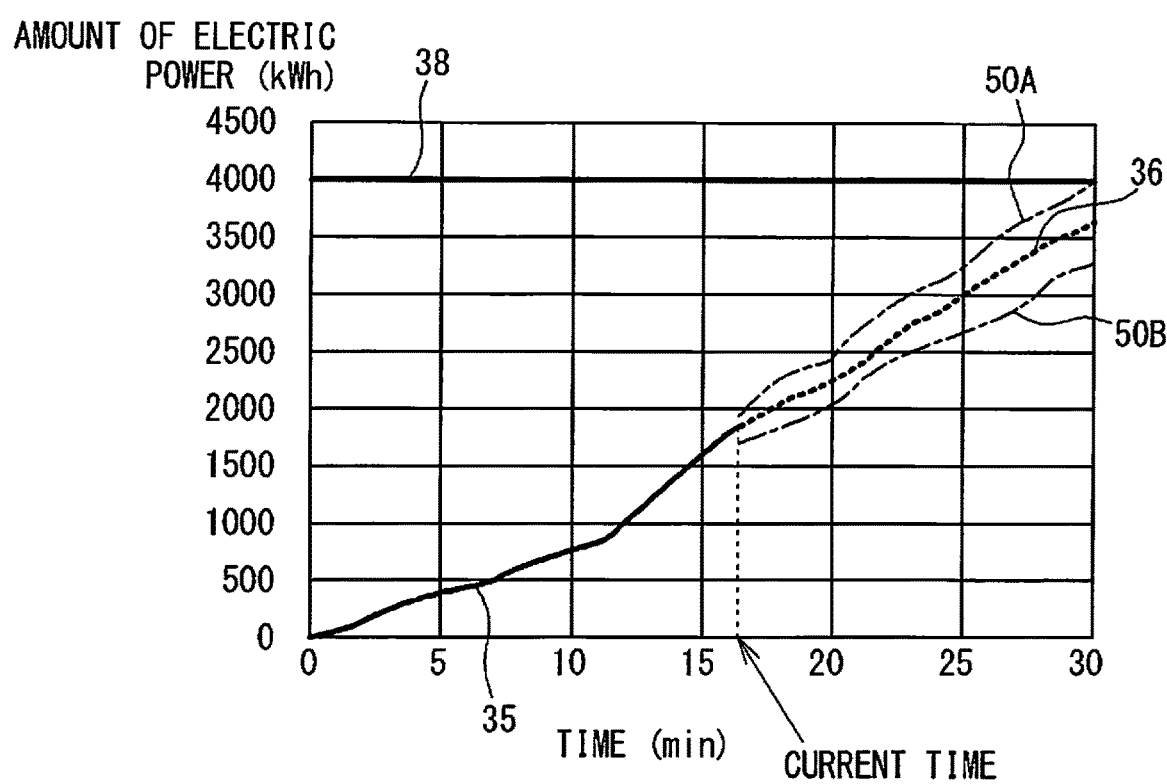
FIG. 11 is a diagram showing an example of a graph created by the creation unit.

The creation unit 13 may further create a graph showing a confidence interval of a predicted received electric power amount. FIG. 11 is a diagram showing an example of a graph created by the creation unit 13. The creation unit 13 creates a graph obtained by further showing a confidence interval (confidence lines 50A and 50B) of the predicted received electric power amount 36 from the current time onward on the graph shown in FIG. 5. The confidence interval indicated by the confidence lines 50A and 50B may be, for example, an interval having a confidence of 99.73%. The confidence lines 50A and 50B respectively indicate a value obtained by adding 3σ to an average of the predicted received electric power amount 36 when population of the predicted received electric power amount 36 is assumed as a normal distribution, and a value obtained by subtracting 3σ from the average. By looking at the graph on which the confidence interval is shown, the manager can know a possibility that the amount of received electric power will exceed the target electric power amount 38. For example, when the entirety of the confidence interval exceeds the target electric power amount 38 at the end of the object demand period, the manager can determine that there is a very high possibility that the amount of received electric power will exceed the target electric power amount 38. In such a case, the manager can take a countermeasure, such as turning off the power of the electric power equipment, with a sense of urgency. Similarly, a confidence interval may be shown for the planned received electric power amount 44 shown in FIG. 8.

The execution unit 16 may execute at least either notification to the manager or control of the electric power equipment on the basis of a relationship between the confidence interval of the predicted received electric power amount 36 and the target electric power amount 38. Accordingly, the execution unit 16 can execute at least either output of a warning or control of the electric power equipment, depending on the magnitude of the possibility that the amount of received electric power will exceed the target electric power amount 38. For example, when the entirety of the confidence interval exceeds the target electric power amount 38 (the confidence lines 50A and 50B exceed the target electric power amount 38) at the end of the object demand period and thus it can be determined that the possibility that the amount of received electric power will exceed the target electric power amount 38 is relatively high, the execution unit 16 may provide a notification to the manager via E-mail or the like and immediately execute control in which the power of the electric power equipment is turned off. In addition, when a part of the confidence interval exceeds the target electric power amount 38 (for example, the confidence line 50A exceeds the target electric power amount 38 but the confidence line 50B does not exceed the target electric power amount 38) at the end of the object demand period and thus there is a possibility that the amount of received electric power will exceed the target electric power amount 38 but it can be determined that the possibility is relatively low, the execution unit 16 may provide a notification to the manager via E-mail or the like but keep the power of the electric power equipment. Moreover, depending on the magnitude of the possibility, the execution unit 16 may change the contents of a notification, or may change the electric power equipment the power of which is to be turned off. Accordingly, when there is a possibility that the amount of received electric power will exceed the target electric power amount 38, a detailed countermeasure can be taken.

Figure 12:
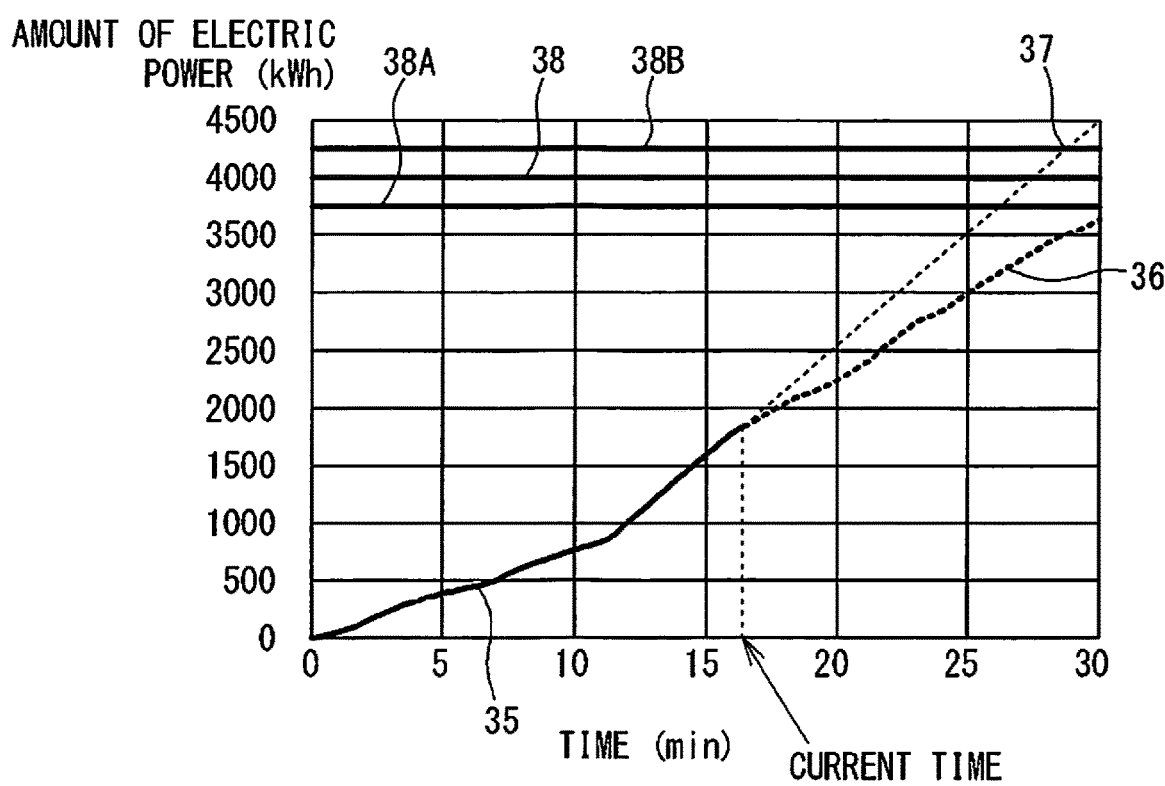
FIG. 12 is a graph including other target electric power amounts in addition to the graph shown in FIG. 3.

The creation unit 13 according to Embodiment 1 creates a graph showing one target electric power amount 38, but may create a graph showing a plurality of target electric power amounts 38. FIG. 12 is a graph including target electric power amounts 38A and 38B in addition to the graph shown in FIG. 3. The target electric power amount 38A has a lower value than the target electric power amount 38, and the target electric power amount 38B has a higher value than the target electric power amount 38. The target electric power amounts 38A and 38B are set on the basis of the target electric power amount 38, and each may be calculated, for example, by adding a certain value to the target electric power amount 38 or multiplying the target electric power amount 38 by a certain value. The execution unit 16 executes at least either notification to the manager of the consumer or control of the electric power equipment installed in the consumer, on the basis of a relationship between the predicted received electric power amount 36 and the target electric power amounts 38, 38A, and 38B. For example, when the predicted received electric power amount 36 has exceeded the target electric power amount 38A, the execution unit 16 sends a message indicating that the predicted received electric power amount 36 has exceeded the target electric power amount 38A and is likely to exceed the target electric power amount 38 soon, to the manager via E-mail. When the predicted received electric power amount 36 has exceeded the target electric power amount 38, the execution unit 16 sends a message indicating that the predicted received electric power amount 36 has exceeded the target electric power amount 38, to the manager via E-mail. When the predicted received electric power amount 36 has exceeded the target electric power amount 38B, the execution unit 16 turns off the power of the electric power equipment and sends a message indicating that the power of the electric power equipment has been turned off, to the manager via E-mail. Accordingly, the execution unit 16 can take a detailed countermeasure on the basis of the relationship between the predicted received electric power amount 36 and the plurality of target electric power amounts 38, 38A, and 38B.

Figure 13:
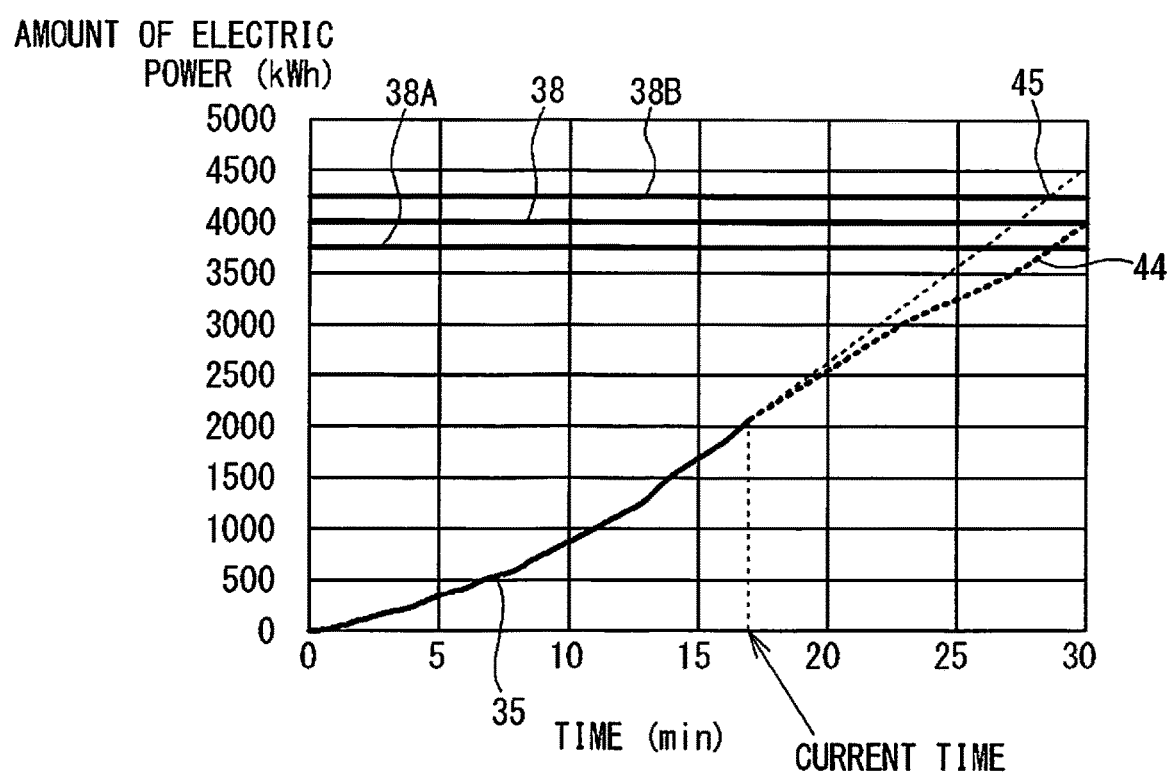
FIG. 13 is a graph including other target electric power amounts in addition to the graph shown in FIG. 8.

Similarly, the creation unit 23 according to Embodiment 2 may create a graph including a plurality of target electric power amounts 38. FIG. 13 is a graph including target electric power amounts 38A and 38B in addition to the graph shown in FIG. 8. The target electric power amounts 38A and 38B are set in the same manner as those in FIG. 12. The execution unit 24 executes at least either notification to the manager of the consumer or control of the electric power equipment installed in the consumer, on the basis of a relationship between the planned received electric power amount 44 from the current time onward and the target electric power amounts 38, 38A, and 38B. The process executed by the execution unit 24 is the same as the process executed by the execution unit 16 described with reference to FIG. 12, except that the predicted received electric power amount 36 is changed to the planned received electric power amount 44. Thus, the detailed description thereof is not repeated here.

In the graphs shown in Embodiments 1 and 2, the horizontal axis indicates a time, but may indicate a value corresponding to a time. For example, the horizontal axis may indicate a percentage for which 30 minutes, which is a demand period, is defined as 100%. In addition, the vertical axis indicates an electric power amount, but may indicate a value corresponding to an electric power amount. For example, the vertical axis may indicate a percentage for which a target electric power amount is defined as 100%. Moreover, the vertical axis and the horizontal axis are interchangeable with each other.

A part or all of the components forming the demand monitoring device may be composed of a system LSI. The system LSI is an ultra-multifunctional LSI produced by integrating a plurality of constitutional units on a chip. Specifically, the system LSI is a computer system that includes a microprocessor, a ROM, and a RAM. A computer program is stored in the RAM. The function of the system LSI is achieved by the microprocessor operating according to the computer program.

The present invention may be the methods described above. In addition, the present invention may be a computer program that realizes these methods by a computer, or may be a digital signal composed of the computer program.

Furthermore, the present invention may be a computer-readable non-transitory storage medium, such as a hard disk drive, a CD-ROM, or a semiconductor memory, having the above computer program or the above digital signal stored therein. In addition, the present invention may be the above digital signal that is stored in such a non-transitory storage medium.

Moreover, the present invention may be the above computer program or the above digital signal that is transmitted via a network such as an electronic communication line, a wired or wireless communication line, or the internet, data broadcasting, or the like.

Each step included in the above program may be executed by a plurality of computers.

Furthermore, the above embodiments and the above modifications may be combined.

Embodiment 3

Each of the demand monitoring devices in Embodiments 1 and 2 described above may be or may not be configured as devices that are physically integrated with each other or are disposed close to each other to form one set. That is, components for demand monitoring can be present so as to be spatially separated from each other such that the components form a demand monitoring system as a whole without limitation on the locations thereof.

Figure 15:
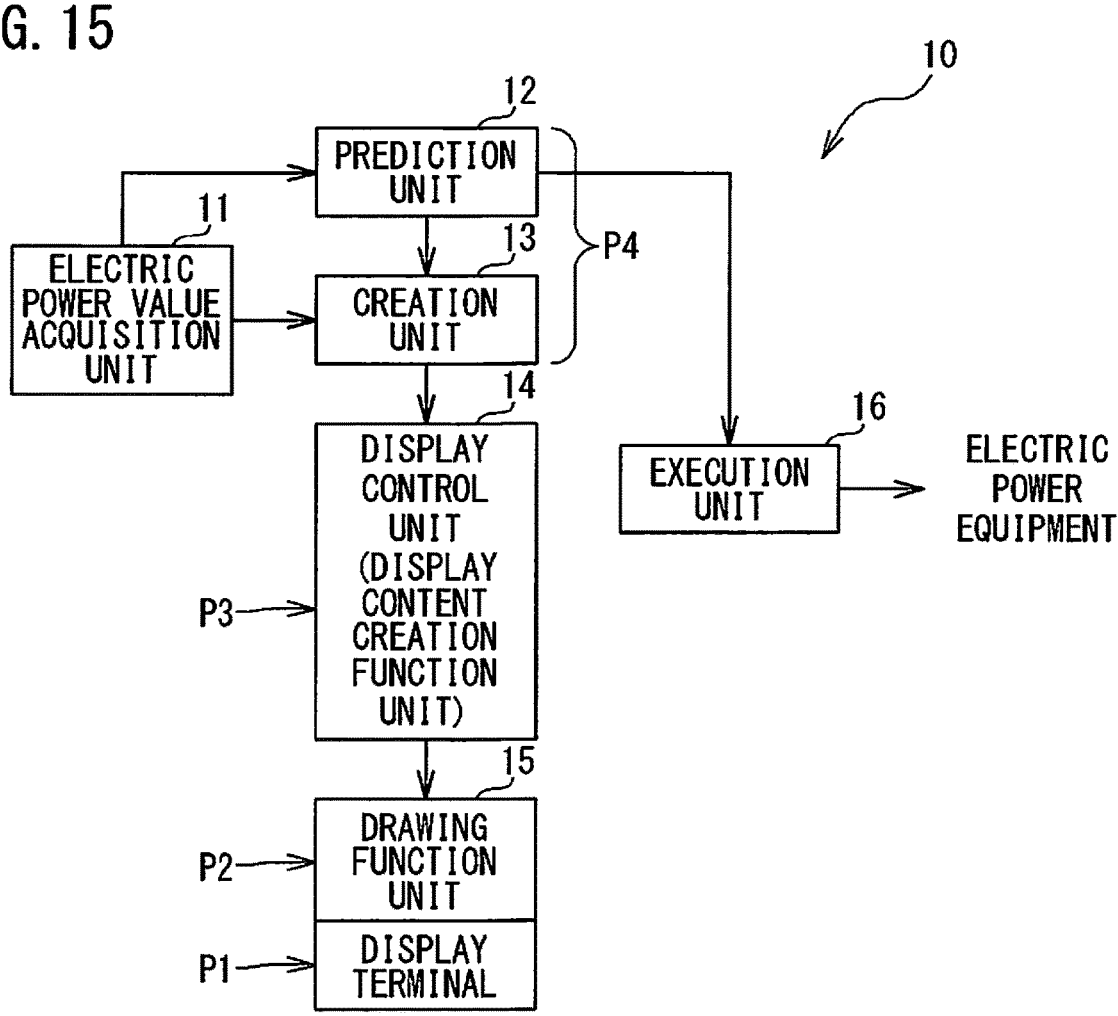
FIG. 15 is a block diagram obtained when, for example, a display unit in the block diagram in FIG. 1 is considered to be divided to a display terminal having a single function of only displaying such as a display or a monitor and a drawing function unit.

FIG. 15 is a block diagram obtained when, for example, the display unit 15 (display device) in the block diagram in FIG. 1 is considered to be divided to a display terminal P1 having a single function of only displaying such as a display or a monitor and a drawing function unit P2. Here, the display control unit 14 is a display content creation function unit P3 having a function to create contents that are to be displayed (for example, a Web server), and a combination of the prediction unit 12 the creation unit 13 is a numeric value creation function unit P4 that creates (predicts, plans, etc.) numeric values that are to be used for displaying. The spatial locations of these elements P1, P2, P3, and P4 will be considered.

Figure 16:
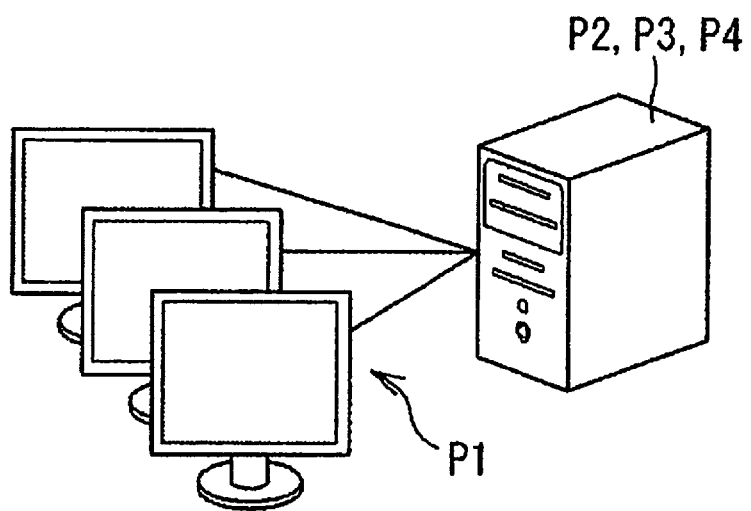
FIG. 16 is a conceptual diagram of an arrangement showing a first example of a demand monitoring system.
Figure 17:
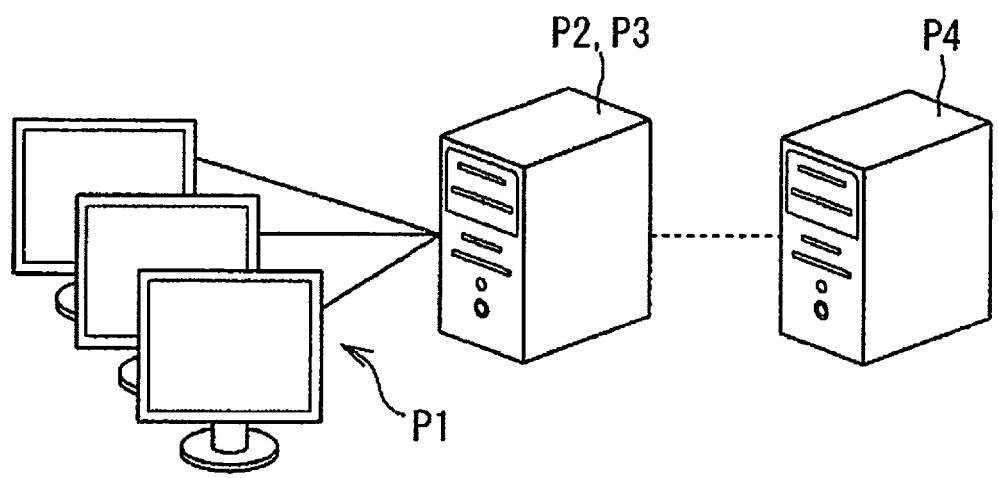
FIG. 17 is a conceptual diagram of an arrangement showing a second example of the demand monitoring system.
Figure 18:
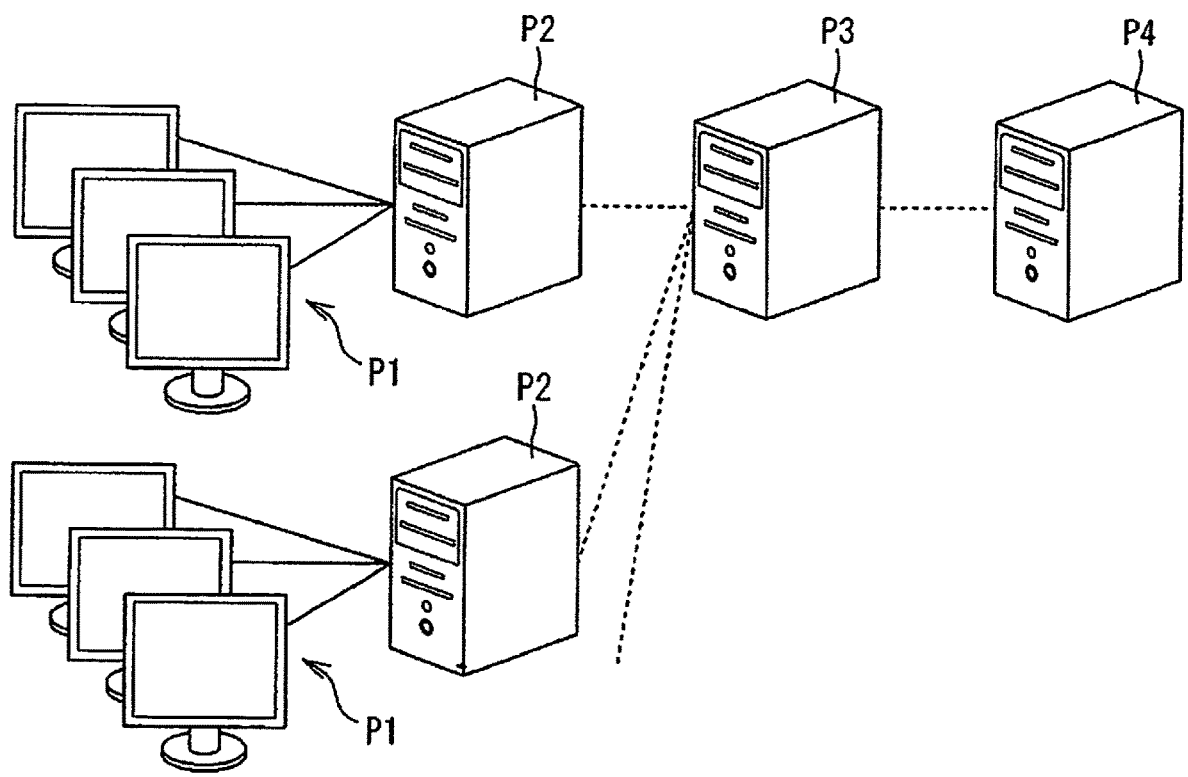
FIG. 18 is a conceptual diagram of an arrangement showing a third example of the demand monitoring system.

FIG. 16 to FIG. 18 are each a conceptual diagram of an arrangement showing an example of the demand monitoring system. Regarding lines connecting the elements in the drawings, each solid line indicates wired or wireless video output, and each dotted line indicates wired or wireless network connection.

First, in FIG. 16, only a plurality of display terminals P1 are located at spatially distant positions, and the other elements, that is, the drawing function unit P2, the display content creation function unit P3, and the numeric value creation function unit P4, are present together. In this case, the plurality of display terminals P1 can be installed dispersedly so as to be spatially separated from the drawing function unit P2, the display content creation function unit P3, and the numeric value creation function unit P4.

Next, in FIG. 17, the display terminals P1 are located in the same manner as in FIG. 16, but the drawing function unit P2 and the display content creation function unit P3 are present together, and the numeric value creation function unit P4 is spatially separated from the drawing function unit P2 and the display content creation function unit P3. In this case, the drawing function unit P2 and the display content creation function unit P3 can be configured as a physically independent device. In addition, the location where the numeric value creation function unit P4 is installed is any location.

Next, in FIG. 18, the display terminals P1, the drawing function unit P2, the display content creation function unit P3, and the numeric value creation function unit P4 are located independently of each other and spatially separated from each other. A plurality of sets of display terminals P1 and drawing function units P2 can be provided under the umbrella of the display content creation function unit P3. In this case, the location where the display content creation function unit P3 is installed can be any location, and network distribution can be enabled under the umbrella of the display content creation function unit P3. As the display terminals P1 and the drawing function units P2 in this case, for example, smartphones and tablet computers can also be used.

Of the components in FIG. 18, a plurality of sets of parts other than the numeric value creation function unit P4 may be provided, and the numeric value creation function unit P4 may be provided at the higher order of these sets. In this manner, a plurality of sets can be provided under the umbrella of the numeric value creation function unit P4. In addition, another computer may be provided at the higher order of the numeric value creation function unit P4.

Various variations of arrangement are conceivable as described above, and the components of the "demand monitoring system" can be present without not only the spatial or geographical locations thereof but also the owners thereof being limited. In addition, the locations can be virtual locations such as a cloud. Of course, FIG. 16 to FIG. 18 are merely examples, and other various arrangements and configurations are possible.

(Supplementary Notes)

The embodiments disclosed herein are merely illustrative in all aspects and should not be recognized as being restrictive. The scope of the present invention is defined by the scope of the claims rather than by the meaning described above, and is intended to include meaning equivalent to the scope of the claims and all modifications within the scope.

REFERENCE SIGNS LIST 10, 20 demand monitoring device
11 electric power value acquisition unit
12 prediction unit
13, 23 creation unit
14 display control unit
15 display unit
16, 24 execution unit
21 plan calculation unit
22 equipment control unit
P1 display terminal
P2 drawing function unit
P3 display content creation function unit
P4 numeric value creation function unit

The invention claimed is:

1. A demand monitoring device which monitors an amount of electric power received by a consumer in which a distributed power source is installed and that self-consumes electric power generated by the distributed power source, the demand monitoring device comprising:
   a prediction unit predicting electric power to be received by the consumer in a future time; and
   a creation unit creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted by the prediction unit, and (iii) a target electric power amount based on contract electric power of the consumer.

2. The demand monitoring device according to claim 1, wherein
   the prediction unit predicts, every demand period, received electric power in the demand period on the basis of: demand electric power of the consumer at a time previous to the demand period; and electric power generated by the consumer at the previous time, and the creation unit creates the graph in which a first axis is an axis for a time in an object demand period which is a monitoring object demand period or for a value corresponding to the time.

3. The demand monitoring device according to claim 2, wherein, every demand period, the prediction unit predicts received electric power in the demand period on the basis of: at least one of demand electric power of the consumer at a time previous to the demand period, electric power generated by the consumer at the previous time, electric power received by the consumer at the previous time, a known schedule of the consumer in the demand period, predicted weather information, and observed weather information; and at least one of demand electric power of the consumer in the demand period, electric power generated by the consumer in the demand period, and electric power received by the consumer in the demand period.

4. The demand monitoring device according to claim 2, wherein
the prediction unit predicts a plurality of received electric powers in the object demand period by using a plurality of prediction methods for predicting received electric power, and
the creation unit creates the graph showing, as the predicted value for an amount of received electric power from the current time onward, a plurality of predicted values for an amount of received electric power from the current time onward, the predicted values being predicted by the prediction unit.

5. The demand monitoring device according to claim 2, wherein the creation unit creates the graph further showing a confidence interval of the predicted value or the planned value for an amount of received electric power from the current time onward.

6. The demand monitoring device according to claim 5, further comprising an execution unit executing at least either notification to a manager or control of electric power equipment on the basis of a relationship between the predicted value or the planned value for an amount of received electric power from the current time onward and the target electric power amount, wherein
the execution unit further executes at least either notification to the manager or control of the electric power equipment on the basis of a relationship between the confidence interval of the predicted value or the planned value for an amount of received electric power and the target electric power amount.

7. A demand monitoring device which monitors an amount of electric power received by a consumer in which a distributed power source is installed and that self-consumes electric power outputted by the distributed power source, the demand monitoring device comprising:
a plan calculation unit calculating a planned received electric power which is a planned value for received electric power of the consumer, by calculating an operation plan of electric power equipment installed in the consumer; and
a creation unit creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer, wherein
the plan calculation unit calculates the planned received electric power for which output electric power of the distributed power source is taken into consideration, by calculating an operation plan of the electric power equipment including the distributed power source.

8. The demand monitoring device according to claim 7, wherein
the plan calculation unit calculates a planned received electric power which is a planned value for received electric power of the consumer, by calculating an operation plan of electric power equipment on the basis of predicted demand electric power obtained by predicting demand electric power of the consumer, the electric power equipment being installed in the consumer,
the creation unit creates a graph in which a first axis is an axis for a time in an object demand period which is a monitoring object demand period or for a value corresponding to the time, and
the plan calculation unit calculates the planned received electric power for which output electric power of the distributed power source is taken into consideration, by calculating an operation plan of the electric power equipment including the distributed power source on the basis of the predicted demand electric power.

9. The demand monitoring device according to claim 8, wherein the creation unit creates the graph further showing an electric power amount calculated on the basis of the predicted demand electric power.

10. A demand monitoring method for monitoring an amount of electric power received by a consumer in which a distributed power source is installed and that self-consumes electric power generated by the distributed power source, the demand monitoring method comprising:
a prediction step of predicting electric power to be received by the consumer in a future time; and
a creation step of creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted in the prediction step, and (iii) a target electric power amount based on contract electric power of the consumer.

11. A demand monitoring method for monitoring an amount of electric power received by a consumer in which a distributed power source is installed and that self-consumes electric power outputted by the distributed power source, the demand monitoring method comprising:
a plan calculation step of calculating a planned received electric power which is a planned value for received electric power of the consumer, by calculating an operation plan of electric power equipment installed in the consumer; and
a creation step of creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated in the plan calculation step, and (iii) a target electric power amount based on contract electric power of the consumer, wherein the plan calculation step comprises calculating the planned received electric power for which output electric power of the distributed power source is taken into consideration, by calculating an operation plan of the electric power equipment including the distributed power source.

12. A storage medium having recorded a demand monitoring program for monitoring an amount of electric power received by a consumer in which a distributed power source is installed and that self-consumes electric power generated by the distributed power source, the demand monitoring program for causing a computer to function as:

a prediction unit predicting electric power to be received by the consumer in a future time; and a creation unit creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted by the prediction unit, and (iii) a target electric power amount based on contract electric power of the consumer.

13. A storage medium having recorded a demand monitoring program for monitoring an amount of electric power received by a consumer in which a distributed power source is installed and that self-consumes electric power outputted by the distributed power source, the demand monitoring program for causing a computer to function as:

a plan calculation unit calculating a planned received electric power which is a planned value for received electric power of the consumer, by calculating an operation plan of electric power equipment installed in the consumer; and a creation unit creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer, wherein the plan calculation unit calculates the planned received electric power for which output electric power of the distributed power source is taken into consideration, by calculating an operation plan of the electric power equipment including the distributed power source.

14. A demand monitoring system which monitors an amount of electric power received by a consumer in which a distributed power source is installed and that self-consumes electric power generated by the distributed power source, the demand monitoring system comprising:

a prediction unit predicting electric power to be received by the consumer in a future time; and a creation unit creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) a predicted value for an amount of received electric power from the current time onward, the predicted value being predicted by the prediction unit, and (iii) a target electric power amount based on contract electric power of the consumer.

15. A demand monitoring system which monitors an amount of electric power received by a consumer in which a distributed power source is installed and that self-consumes electric power outputted by the distributed power source, the demand monitoring system comprising:

a plan calculation unit calculating a planned received electric power which is a planned value for received electric power of the consumer, by calculating an operation plan of electric power equipment installed in the consumer; and a creation unit creating a graph in which a first axis is an axis for a time or for a value corresponding to the time and a second axis is an axis for an electric power amount or for a value corresponding to the electric power amount, the graph showing (i) an amount of electric power received by the consumer until a current time, (ii) the planned value for an amount of received electric power from the current time onward, the planned value being calculated by the plan calculation unit, and (iii) a target electric power amount based on contract electric power of the consumer, wherein the plan calculation unit calculates the planned received electric power for which output electric power of the distributed power source is taken into consideration, by calculating an operation plan of the electric power equipment including the distributed power source.

* * * * *